US011109120B2

(12) United States Patent
Panella et al.

(10) Patent No.: US 11,109,120 B2
(45) Date of Patent: Aug. 31, 2021

(54) COMMUNICATION NODE

(71) Applicant: Molex, LLC, Lisle, IL (US)

(72) Inventors: Augusto Panella, Naperville, IL (US); Johnny Chen, Danville, CA (US); Harold Keith Lang, Cary, IL (US)

(73) Assignee: Molex, LLC, Lisle, IL (US)

( * ) Notice: Subject to any disclaimer, the term of this patent is extended or adjusted under 35 U.S.C. 154(b) by 130 days.

(21) Appl. No.: 16/080,478

(22) PCT Filed: Mar. 1, 2017

(86) PCT No.: PCT/US2017/020189
§ 371 (c)(1),
(2) Date: Aug. 28, 2018

(87) PCT Pub. No.: WO2017/151761
PCT Pub. Date: Sep. 8, 2017

(65) Prior Publication Data
US 2019/0069048 A1    Feb. 28, 2019

Related U.S. Application Data

(60) Provisional application No. 62/301,926, filed on Mar. 1, 2016.

(51) Int. Cl.
*H05K 7/00* (2006.01)
*H04Q 1/04* (2006.01)
(Continued)

(52) U.S. Cl.
CPC .............. *H04Q 1/04* (2013.01); *H04L 12/10* (2013.01); *H04Q 1/02* (2013.01); *H04Q 1/13* (2013.01);
(Continued)

(58) Field of Classification Search
None
See application file for complete search history.

(56) References Cited

U.S. PATENT DOCUMENTS 6,443,783 B1    9/2002 Beadle
6,572,411 B1 *  6/2003 Aeschbacher ..... H01R 13/6633
                                                   439/540.1
(Continued)

FOREIGN PATENT DOCUMENTS

CN        1254252 A    5/2000
CN      101982027 A    2/2011
(Continued)

OTHER PUBLICATIONS

International Search Report and Written Opinion received for PCT application No. PCT/US2017/020189, dated May 24, 2017, 9 pages.
(Continued)

*Primary Examiner* — Jinhee J Lee
*Assistant Examiner* — Rashen E Morrison

(57) ABSTRACT

A solution is provided that can be used in a communication node. A case is provided that supports a card module. The card module includes a circuit board with a front edge and a rear edge and includes a chiclet mounted adjacent the front edge. A housing can be pressed onto the circuit board and chiclet and be retain the housing in place. A transformer box is provided is provided on the circuit board between the housing and the rear edge. A POE card can be mounted on the circuit board between the transformer box and the housing.

9 Claims, 38 Drawing Sheets

(51) Int. Cl.
*H04Q 1/02* (2006.01)
*H04Q 1/20* (2006.01)
*H04L 12/10* (2006.01)
*H05K 1/14* (2006.01)
*H05K 1/18* (2006.01)

(52) U.S. Cl.
CPC ............... *H04Q 1/20* (2013.01); *H05K 1/144* (2013.01); *H05K 1/181* (2013.01); *H05K 7/00* (2013.01); *H05K 2201/042* (2013.01); *H05K 2201/1003* (2013.01); *H05K 2201/10333* (2013.01); *H05K 2201/10545* (2013.01)

(56) References Cited

U.S. PATENT DOCUMENTS

| | | | | |
|---|---|---|---|---|
| 6,945,820 | B1* | 9/2005 | Blichasz | H01R 13/6658 439/620.05 |
| 6,979,205 | B2 | 12/2005 | Hoopes et al. | |
| 7,052,315 | B2* | 5/2006 | Murr | H01R 13/6658 439/540.1 |
| 7,121,898 | B2* | 10/2006 | Murr | H01R 24/64 439/676 |
| 7,845,984 | B2* | 12/2010 | Schaffer | H01R 12/716 439/620.18 |
| 7,854,634 | B2* | 12/2010 | Filipon | H01R 13/6658 439/676 |
| 7,898,819 | B2* | 3/2011 | Pfingsten | H01R 13/514 361/800 |
| 8,158,883 | B2 | 4/2012 | Soffer | |
| 8,449,332 | B2* | 5/2013 | Purkis | H01R 24/64 439/620.18 |
| 8,794,997 | B2 | 8/2014 | Tin | |
| 8,837,517 | B2 | 9/2014 | Marr et al. | |
| 8,885,334 | B1 | 11/2014 | Baxter | |
| 8,888,538 | B2* | 11/2014 | Regnier | H01R 12/724 439/676 |
| 9,256,254 | B2 | 2/2016 | Appleton | |
| 9,312,673 | B2 | 4/2016 | Byrne et al. | |
| 9,385,485 | B2* | 7/2016 | Hsu | H01R 24/64 |
| 10,098,179 | B2 | 10/2018 | Yamamichi et al. | |
| 2003/0211782 | A1* | 11/2003 | Esparaz | H01R 13/6658 439/620.11 |
| 2006/0166550 | A1* | 7/2006 | Murr | H01R 13/6658 439/540.1 |
| 2008/0082705 | A1 | 4/2008 | Shirley et al. | |
| 2008/0084674 | A1 | 4/2008 | Silverbrook et al. | |
| 2011/0162081 | A1 | 6/2011 | Lopez et al. | |
| 2012/0218703 | A1 | 8/2012 | Cho et al. | |
| 2012/0309236 | A1 | 12/2012 | Purkis et al. | |
| 2015/0056825 | A1* | 2/2015 | Hsu | H01R 13/6633 439/78 |
| 2015/0056826 | A1* | 2/2015 | Gao | H01R 13/6587 439/78 |
| 2015/0237058 | A1 | 8/2015 | Chritz et al. | |
| 2016/0021434 | A1 | 1/2016 | Arakawa et al. | |

FOREIGN PATENT DOCUMENTS

| | | |
|---|---|---|
| CN | 201754266 U | 3/2011 |
| CN | 102105872 A | 6/2011 |
| CN | 204291276 U | 4/2015 |
| JP | 2003-143150 A | 5/2003 |
| JP | 2007-073956 A | 3/2007 |
| KR | 10-2008-0102284 A | 11/2008 |
| TW | 531978 B | 11/2003 |
| TW | 200511806 A | 3/2005 |
| TW | M294056 U | 7/2006 |
| TW | I438873 B | 5/2014 |
| WO | 2007/012148 A1 | 2/2007 |
| WO | 2007/121148 A2 | 10/2007 |
| WO | 2011/057195 A2 | 5/2011 |
| WO | 2017/035301 A1 | 3/2017 |
| WO | 2017/151761 A1 | 9/2017 |

OTHER PUBLICATIONS

International Preliminary Report on Patentability received for PCT Application No. PCT/US2017/020189, dated Sep. 13, 2018, 8 pages.
International Search Report and Written Opinion received for PCT application No. PCT/US2016/048549, dated Nov. 29, 2016, 9 pages.
International Preliminary Report on Patentability received for PCT Application No. PCT/US2016/048549, dated Mar. 8, 2018, 8 pages.
Office Action received for Japanese Application No. 2018-509616, dated Feb. 19, 2019, 8 pages. (4 pages of English Translation and 4 pages of Official Copy).
Extended European Search Report received for European Patent Application Na 16840082.8, dated Mar. 29, 2019, 8 pages.
Office Action received for Korean Application No. 10-2018-7008013, dated Jun. 4, 2019, 9 pages. (5 pages of English Translation and 4 pages of Official Copy).
Office Action received for Japanese Application No. 2018-545289, dated Jul. 2, 2019, 7 pages. (3 pages of English Translation and 4 pages of Official Copy).
Extended European Search Report received for European Patent Application No. 17760713.2, dated Sep. 24, 2019, 6 pages.
Notice of Allowance received for U.S. Appl. No. 15/745,161, dated Sep. 26, 2019, 10 pages.
Decision to Grant received for KR application No. 10-2018-7027981, dated Aug. 20, 2020, 2 pages. (1 page of english translation and 1 page of official copy).
Office Action received for JP Application No. 2018-509616, dated Jun. 1, 2021, 40 Pages (21 Pages of English Translation and 19 Pages of Official notification).

* cited by examiner

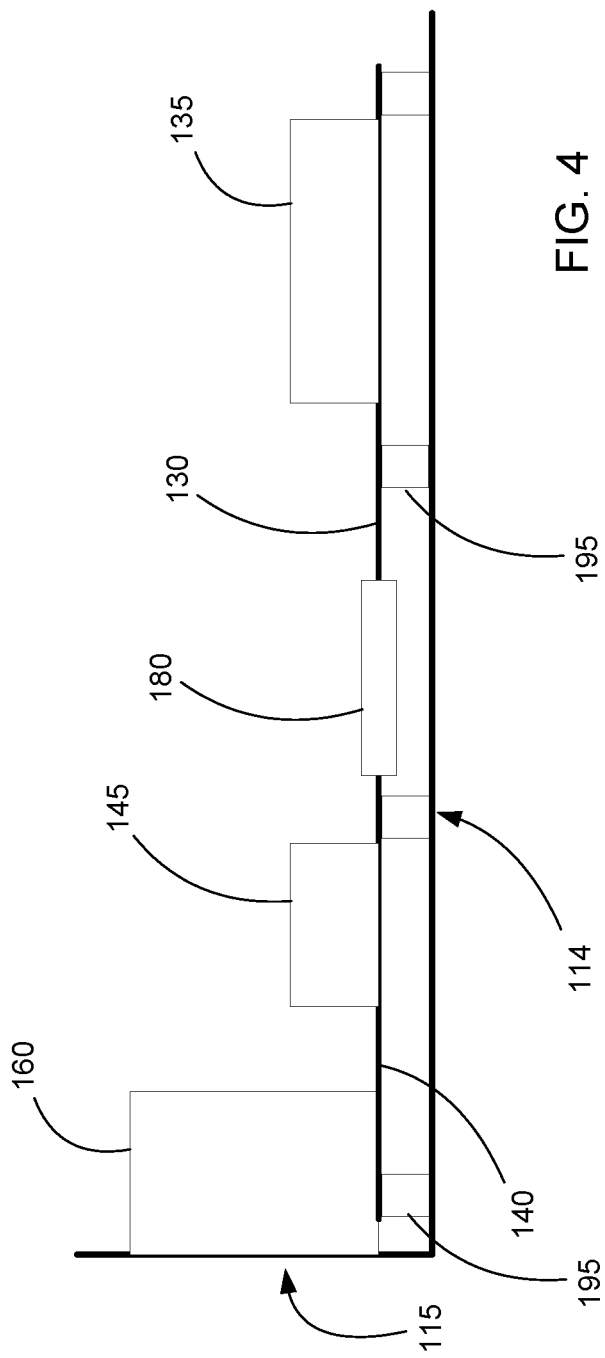

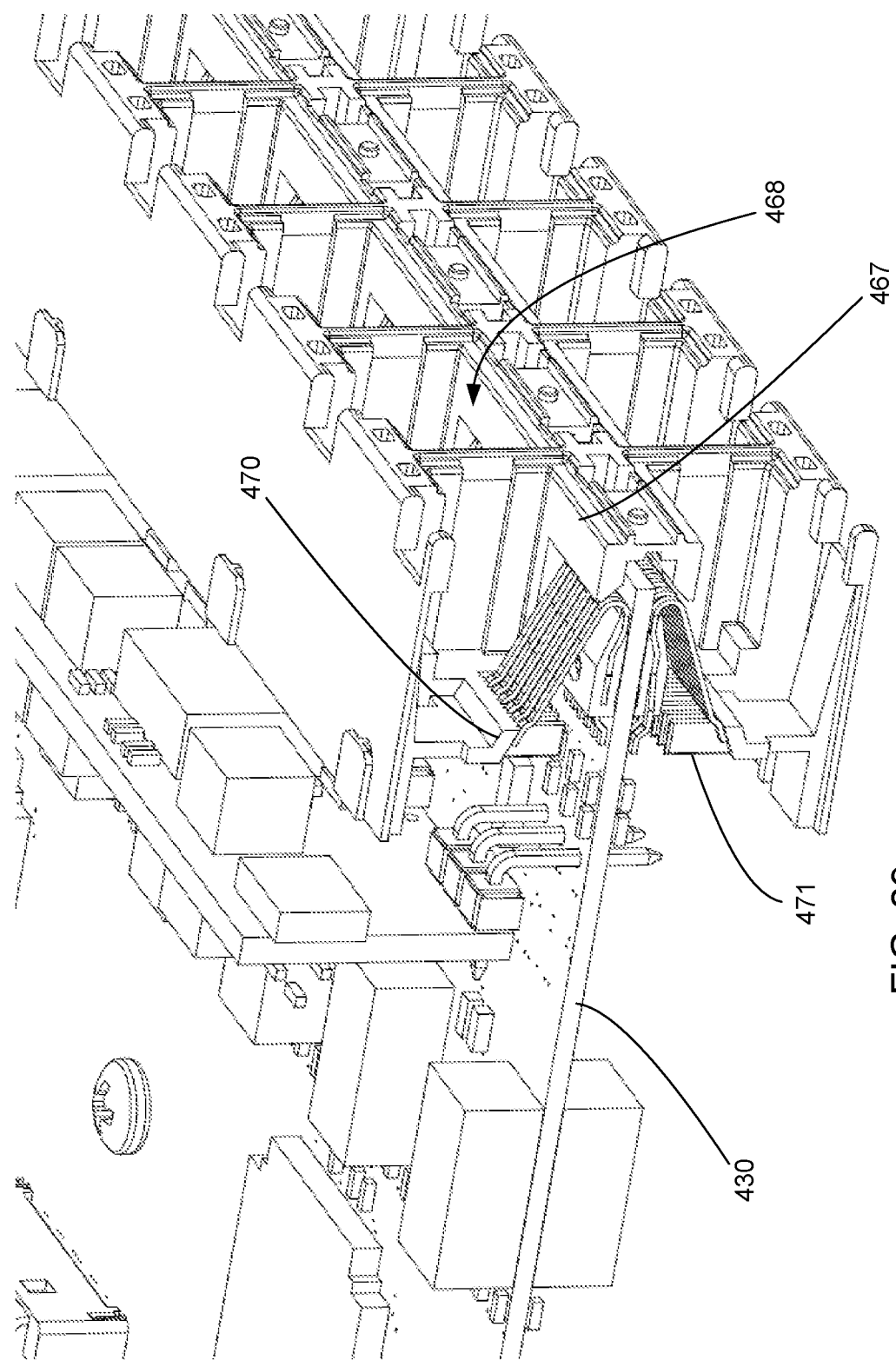

COMMUNICATION NODE

RELATED APPLICATIONS

This application is a national stage of International Application No. PCT/US2017/020189, filed Mar. 1, 2017, which claims priority to U.S. Provisional Application No. 62/301,926, filed Mar. 1, 2016, both of which are incorporated herein by reference in their entirety.

TECHNICAL FIELD

This disclosure relates to field of network switches, more specifically to an architecture that allows for improved performance and reduced costs.

DESCRIPTION OF RELATED ART

Switches and routers and other communication devices (which shall collectively be referred to as a communication node herein) are commonly used to provide communication between different computing devices. The computing devices, which can take a variety of forms, may be located within a rack in a server or may be located in dispersed locations in the same server room, within the same building or somewhere else entirely. Regardless of the location of the computing devices, the communication node will include a plurality of ports that allow cables to connect the communication node to the various computing devices.

FIG. 1 illustrates a typical communication node 10. The communication node 10 includes a case 14 with a face 15 that has a plurality of ports 18. The ports can be a variety of different configurations, such as, without limitation, QSFP receptacles, SFP receptacles, 8P8C (commonly known as an RJ45, which is the term that will used herein) or other desirable configuration and can be stacked, ganged or in a single port configuration. As can be appreciated, while ports are depicted as being on the face 15, they can also be on other (and even multiple) faces of the case 14 if desired.

The case 14 supports a circuit board 30 (sometimes referred to as a motherboard) that in turn supports integrated circuit (IC) module 35. The IC module 35 can include various processing and memory components as is known in the industry and the desired level of functionality will depend on the purpose and application that the communication mode is intended for. The circuit board 30 also supports a PHY module 45. The PHY module 45 is configured to connect a link layer device (which can be referred to a media access control or MAC) to a physical medium such a copper cables or optical fibers. Thus the PHY module 45 takes digital signals from the IC module 35 and converts those signals into analog signals that can be transmitted over cables and optical fibers. The PHY module 45 also receives analog signals and converts those signals into digital signals that can be provided to the IC module 35. As can be appreciated, the PHY module 45 can includes a number of functional circuits that can be combined as needed to support the particular protocol(s) being supported.

As can be appreciated, the circuit board 30 tends to be relatively large as it needs to support the IC module 35 (which can be a combination of a number of different ASICs, as well as memory and other desired circuitry) and it also supports the PHY module 45 (that needs to communicate with the IC module 35) and needs to have sufficient space to allow the various ASICs positioned on it to be cooled (which may require heat sinks to be mounted on the corresponding ASIC). The circuit board also supports ports 60.

The ports 60 can be provided in a variety of configuration, such as, without limitation, a combination of one or more of the industry standard receptacles mounted on the circuit board 30. Examples of possible standard designs include, but are not limited to, SFP, QSFP, CXP, CFP, OCULINK or any other desirable connector configuration. As can be further appreciated, the ports need not be configured for a particular industry standard.

One issue that exists with the current architecture is that it tends to be costly to implement. The PHY module 45 communicates with the ports 60 using analog signals while the PHY module 45 communicates with the IC module 35 using digital signals (thus the PHY module 45 provides a transition between the digital and analog part of the communication channel). This creates a number of issues. One issue is that the digital side of the communication channel tends to require more layers of circuit board in order to provide the appropriate number of channels of communication between the various circuits that make up the IC module 35. This can result in a circuit board with a larger number of layers, which increases the cost of the entire system. As a result, certain individuals would appreciate further improvements in the configuration of a communication node 10.

SUMMARY

An architecture is disclosed for use in devices that are configured to operate as a communication node. A box supports a card module. The card module includes a circuit board and chiclet mounted at a front edge of the circuit board. The chiclet includes terminals configured to engage a mating connector. A housing is mounted over the chiclet and engages the chiclet while defining a port that includes the terminals. A transformer box can be mounted the circuit board spaced apart from the housing toward a rear edge of the circuit board. A transformer in the transformer box couples traces connected to the terminals on a cable side of the transformer to traces on a chip side of the transformer. A Power over Ethernet (POE) card can be mounted on the card module between the transformer box and the housing. The design provides for ease of manufacturing while potentially providing improvements in system level costs.

BRIEF DESCRIPTION OF THE DRAWINGS

The present invention is illustrated by way of example and not limited in the accompanying figures in which like reference numerals indicate similar elements and in which:

FIG. 4 illustrates another schematic representation of an embodiment of a communication node.

FIG. 29 illustrates a perspective cross-sectional view of the embodiment depicted in FIG. 27, taken along line 29-29.

DETAILED DESCRIPTION

Figure 1:
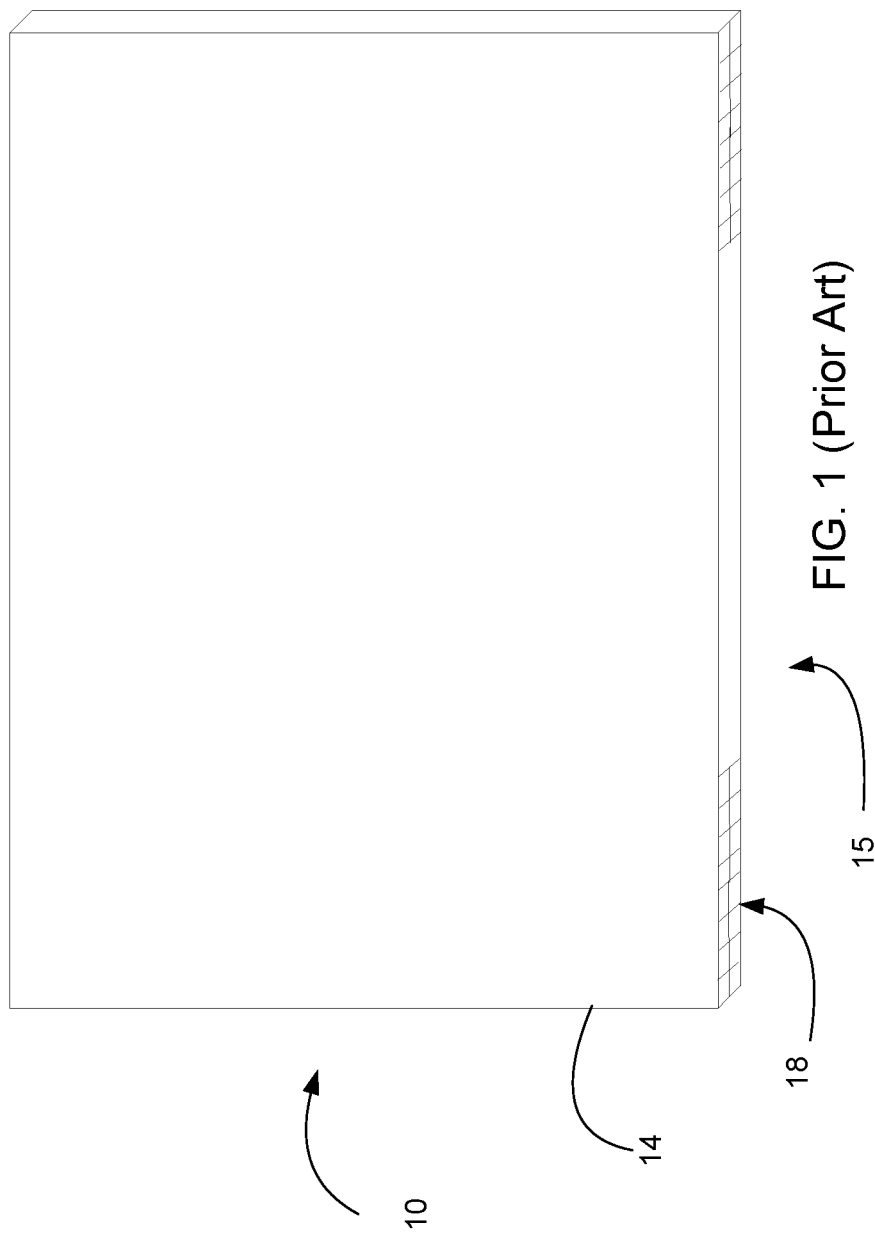
FIG. 1 illustrates a perspective view an embodiment of a prior art communication node.
Figure 2:
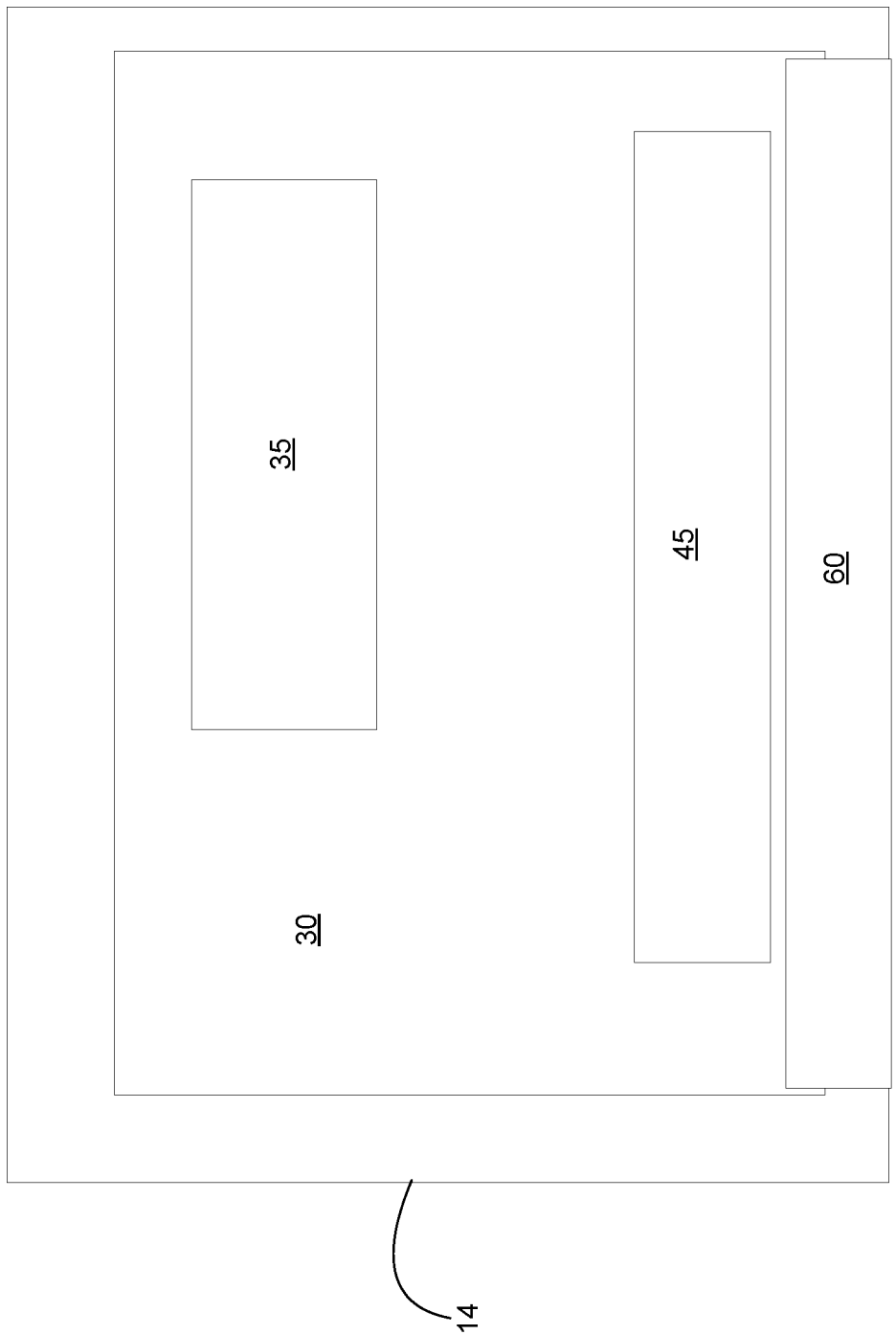
FIG. 2 illustrates a schematic representation of a prior art communication node.

The detailed description that follows describes exemplary embodiments and the features disclosed are not intended to be limited to the expressly disclosed combination(s). Therefore, unless otherwise noted, features disclosed herein may be combined together to form additional combinations that were not otherwise shown for purposes of brevity.

FIGS. 3A-5 schematically illustrate embodiments of a communication node 100. It should be noted that the schematic representations depicted in FIGS. 3A-5 are intended to be positioned in a case and thus are expected to be compatible with conventional communication node construction, at least with respect to the external interface that allows the communication node to be mounted in a server rack and communicate with other devices.

Looking at the FIGS., a case 114 (which can be formed of a conductive material) supports a first circuit board 130 that in turn supports an IC module 135. In an embodiment the circuit board 130 is supported by legs 195 that support the circuit board above the case 114. The circuit board 130 will typically have 6 or more layers and can include 24 or more layers if desired. As noted above, the IC module 135 can include a number of separate components, including digital processors, digital signal processor circuits, memory, encryption circuits and the like, that are in communication with each other. Thus, the IC module 135 can be configured in any desirable manner with any desirable set of ASICs that provide the desired functionality and these components are being collectively referred to as the IC module herein.

The case 114 also supports a second circuit board 140 (as depicted the second circuit board 140 is supported by legs 195 but could also be supported by other mechanical structures). The second circuit board 140 supports a PHY module 145 that is configured to receive and send analog signals and send and receive digital signals. The PHY module 145 is in communication with the first circuit board 130 (and thus the IC module 135) via connector 180 and/or connector 181, which can provide a number of channels for communication therebetween. In an embodiment the connector(s) can provide more than 40 channels of communication. Because the signals between the PHY module 145 and the IC module 135 are digital, the PHY module 145 can be spaced apart from the IC module 135 by significant distances (e.g., more than 13 cm) if desired.

The PHY module 145 is also in communication with a port module 160, which can be a plurality of ports in one or more desired configurations. The port module 160 provides an interface that allows the PHY module 145 to communicate with external components.

As the circuit board 140 is separate from the circuit board 130, the number of layers provided on the circuit board 140 can be different than the number of layers on the circuit board 130. In an embodiment the circuit board 140 can have about 6 layers while the circuit board 130 can have 8 or more layers.

One additional advantage of the bifurcated circuit board design depicted is that the circuit board 140 can be made of a higher performing material. As is known, when supporting high data rates it is often necessary to use signaling frequencies that approach 10 or more GHz. A 50 Gbps channel, for example, might require the use of signaling at 25 GHz (if NRZ encoding is used, for example). Typical circuit board materials, such as FR4, are poorly suited to such high frequencies and create significant insertion loss at frequencies about 10 GHz. Other materials exist that are better suited to high frequencies common in analog circuits but tend to be substantially more expensive. Materials such as NELCO-N4000, for example, provide a much lower loss as high frequencies.

Consequentially, the depicted design allows for selective use of materials. For applications where the PHY module is working with higher frequencies it is possible to use an alternative material for circuit board 140 with losses that are 25% or more lower than what FR4 would provide while continuing to use FR4 for digital circuits (as FR4 is often suitable for digital circuits where the issues that are present in an analog circuit are not nearly as problematic). This allows the selective use of materials, based on the application requirements, without using more layers or more expensive materials where they are not needed. And for situations where the circuit board 130 needs a higher number of layers to manage all the channels of communication, the circuit board 140 can be made of some lesser number of layers (typically not more than 6 layers will be needed) and thus offer a cost savings that extends over the entire surface of the circuit board 140.

As can be appreciated, while two circuit boards are shown, additional circuit boards could be added. In an embodiment, for example, a first circuit board that is intended to work with digital signals could be position in the housing and could be coupled to second circuit board and a third different circuit board, the second and third circuit boards configured to provide analog signals. The second and third circuit boards could be positioned adjacent each other and could also be positioned on two different sides of the first circuit board. Thus, the depicted embodiment provide for substantial architectural flexibility.

Figure 3A:
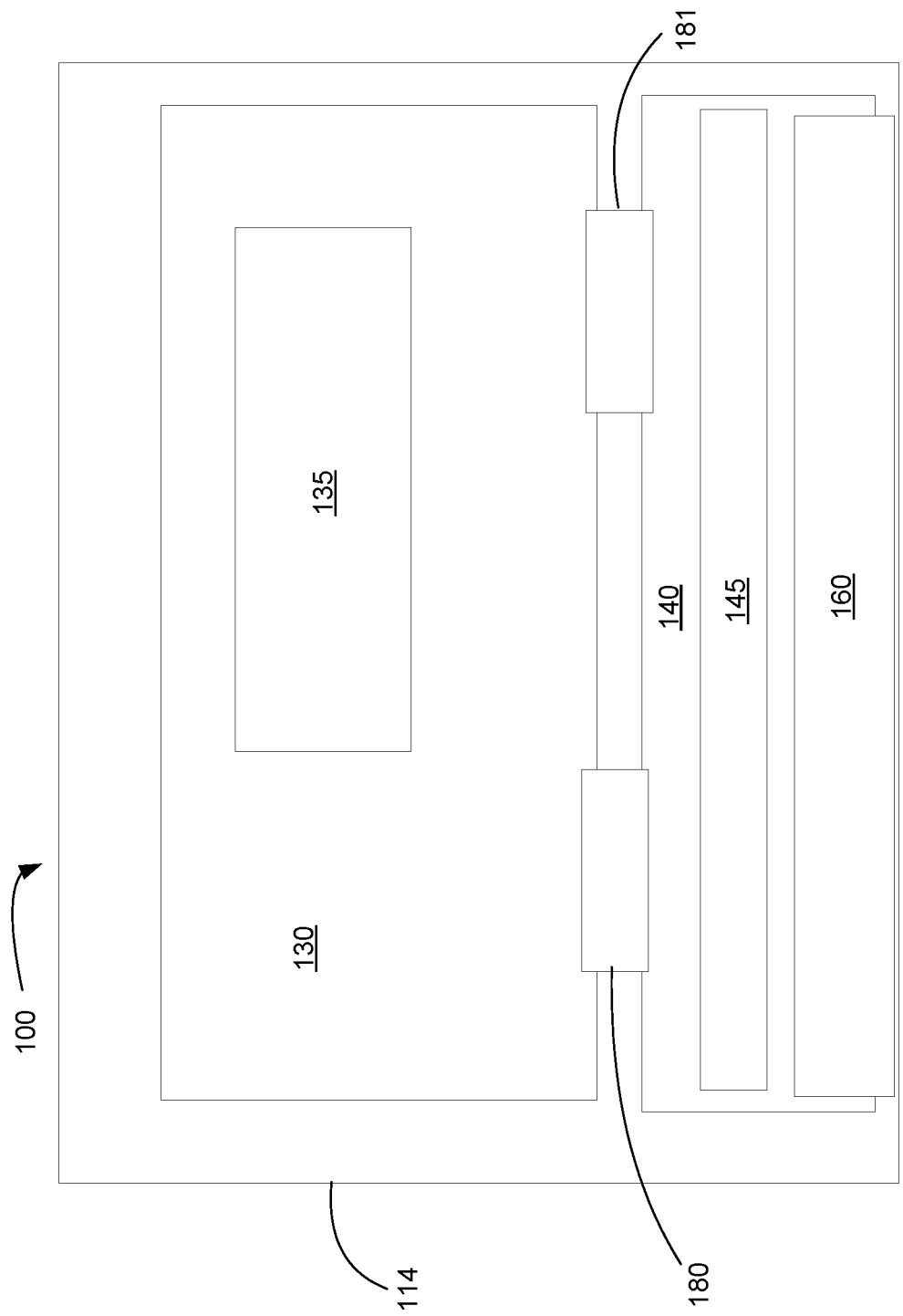
FIG. 3A illustrates a schematic representation of an embodiment of a communication node.
Figure 3B:
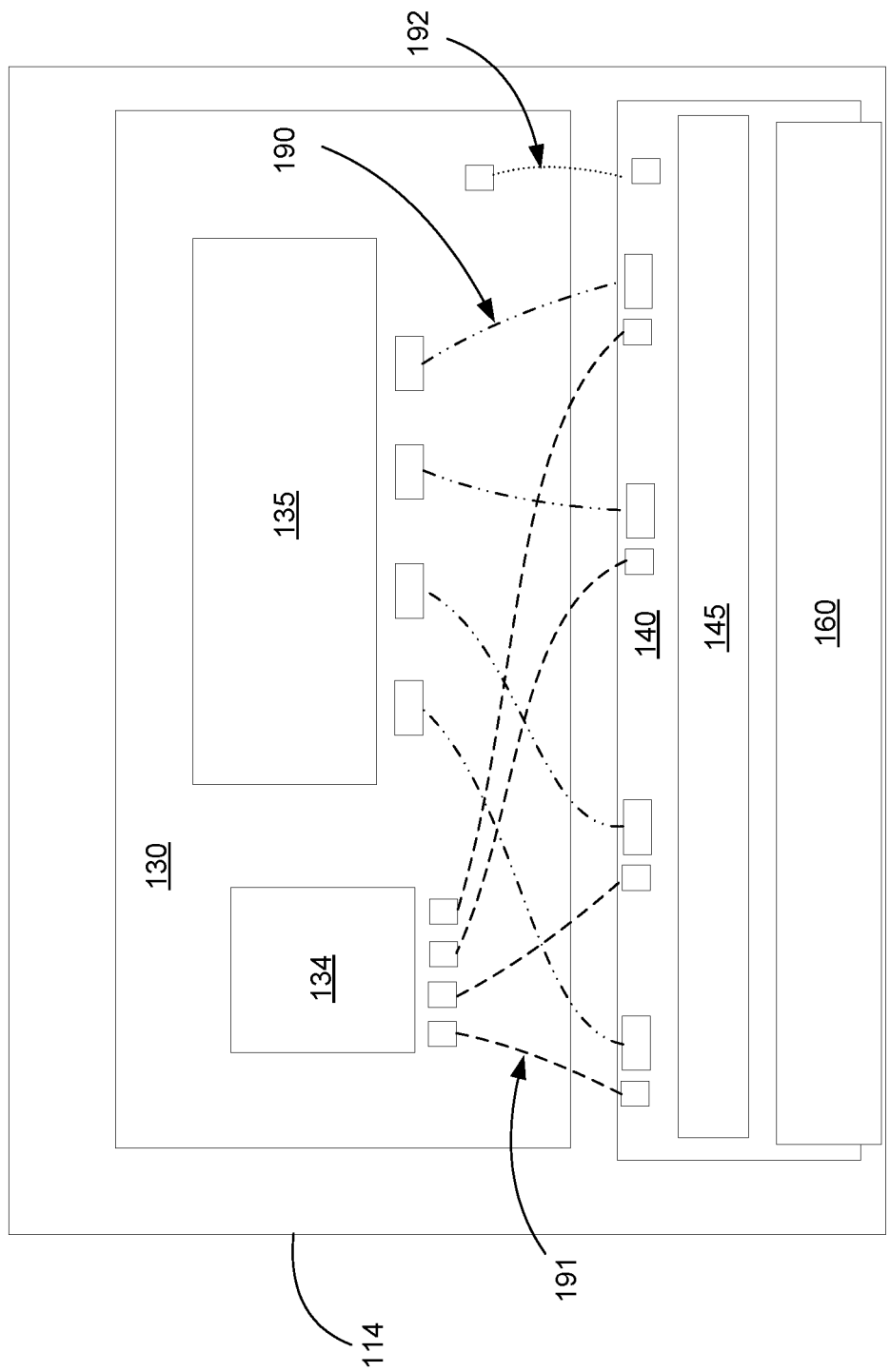
FIG. 3B illustrates another schematic representation of an embodiment of a communication node.

FIG. 3B illustrates additional features that can be incorporated into a communication node. Specifically, it includes an IC module 135 supported by a circuit board 130 that communicates with a PHY module 145 on circuit board 140 via signal communication assembly 190. The use of signal communication assembly 190 (which can be connectors and cables) in such a system is expected to significantly reduce losses between the circuit board 130 and the circuit board 140 as the signal communication assembly 190 will tend to have lower loss than the use of circuit board materials. This will allow the circuit board 130 to provide the desired functionality without the need to worry about transmitting signals across a substantial distance.

Additional features include a power source 134 that can provide power to the circuit board 140 with power transmission assembly 191 (that can also include cables and connectors). As in FIG. 3A, a port module 160 is provided to allow the communication node to communicate with external devices. A power regulator can be included with the PHY module 145 so as to ensure the power provided by the power source 134 is suitably controlled (which will, in certain circumstances, allow the port module to operate more effectively). An additional communication assembly 192 can be used to help control the operation of the PHY module 140 by providing various communication, control and timing signals, as desired, to ensure the PHY module 140 is operating in an intended manner.

Figure 3C:
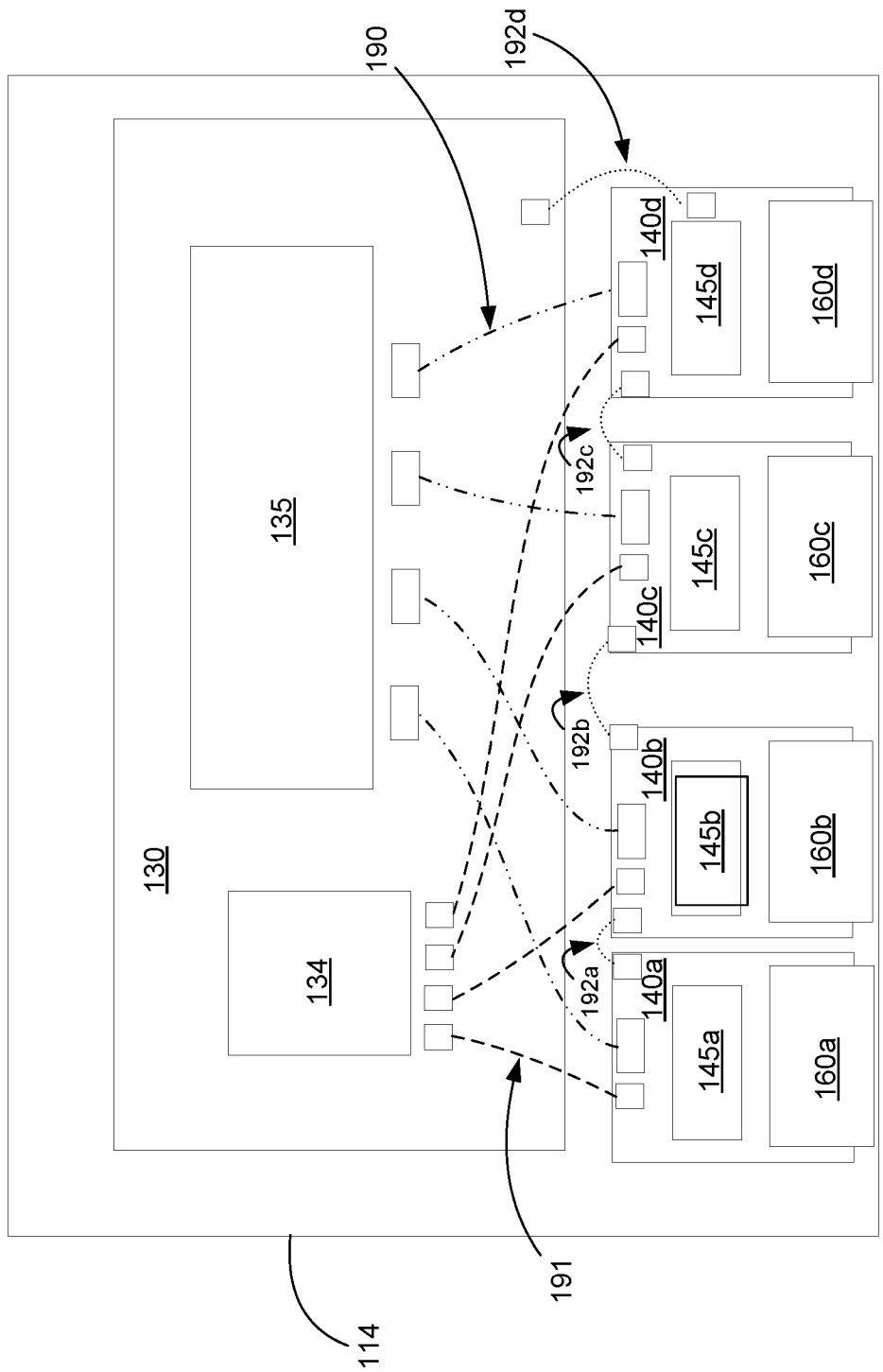
FIG. 3C illustrates another schematic representation of an embodiment of a communication node.

FIG. 3C illustrates another embodiment that is similar to the embodiment depicted in FIG. 3B but includes separate circuit boards 140a-140d that each support a port module 145a-145d, respectively. Each circuit board 140a-140d also supports a respective PHY module 145a-145d and a respective port module 160a-160d. The power transmission assembly 191 and signal communication assembly 190 are also included but can be configured so that a separate path is provided to each of the circuit boards 140a-140d. Control communication assemblies 192a-192d, which can extend between two circuit boards 140a-140d or between the circuit board 130 and one of the circuit boards 140a-140d or some combination thereof, allow for the provision of communication, control and timing signals to the PHY modules 145a-145d as desired.

FIG. 4 illustrates a schematic representation of the features depicted in FIG. 3A and illustrates a potential physical orientation. As can be appreciated, supports 195 can be used to support the circuit boards 130, 140 in a case 114 so that port module 160 is positioned on a face 115 of the case 114. As noted above, one or more connectors 180 (which can be any desired type of connector system such as a cable assembly or board to board connector) can be used to provide signal paths between the circuit board 130, 140.

Figure 5:
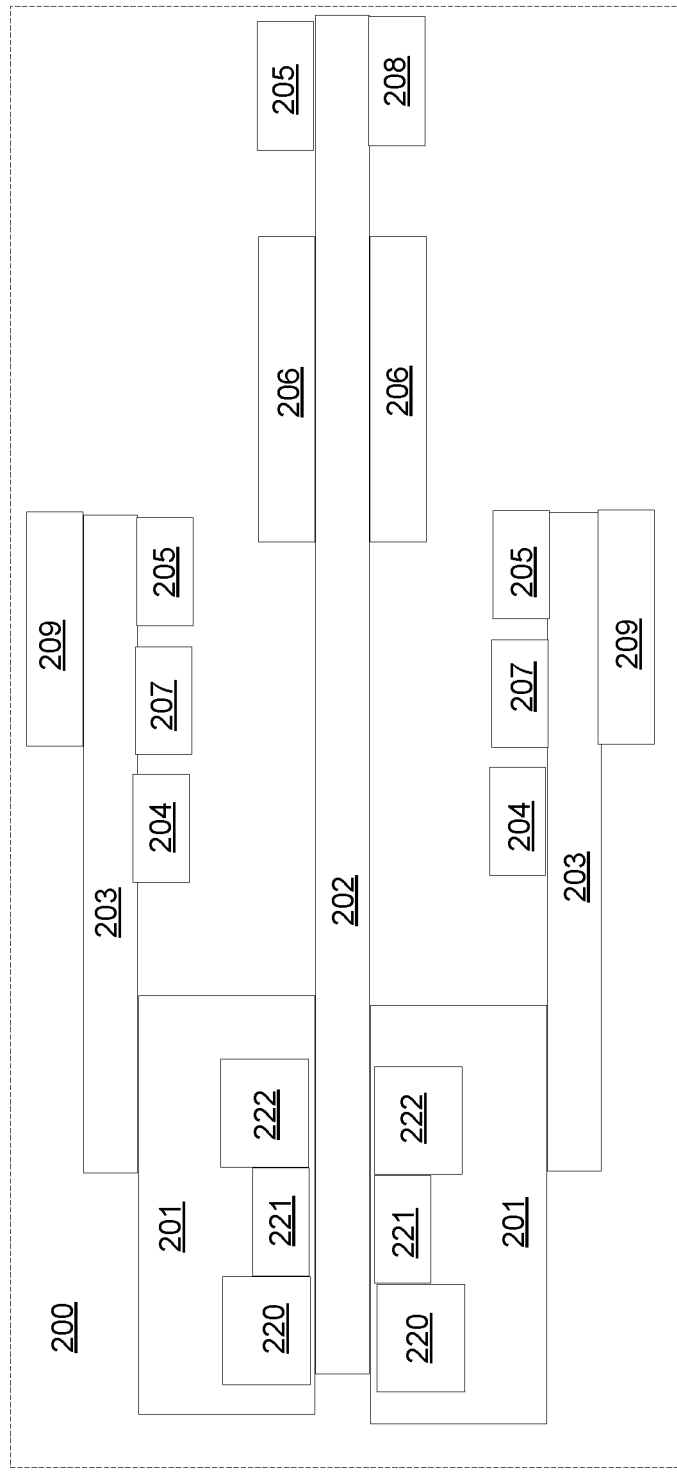
FIG. 5 illustrates another schematic representation of an embodiment of a communication node.
Figure 6:
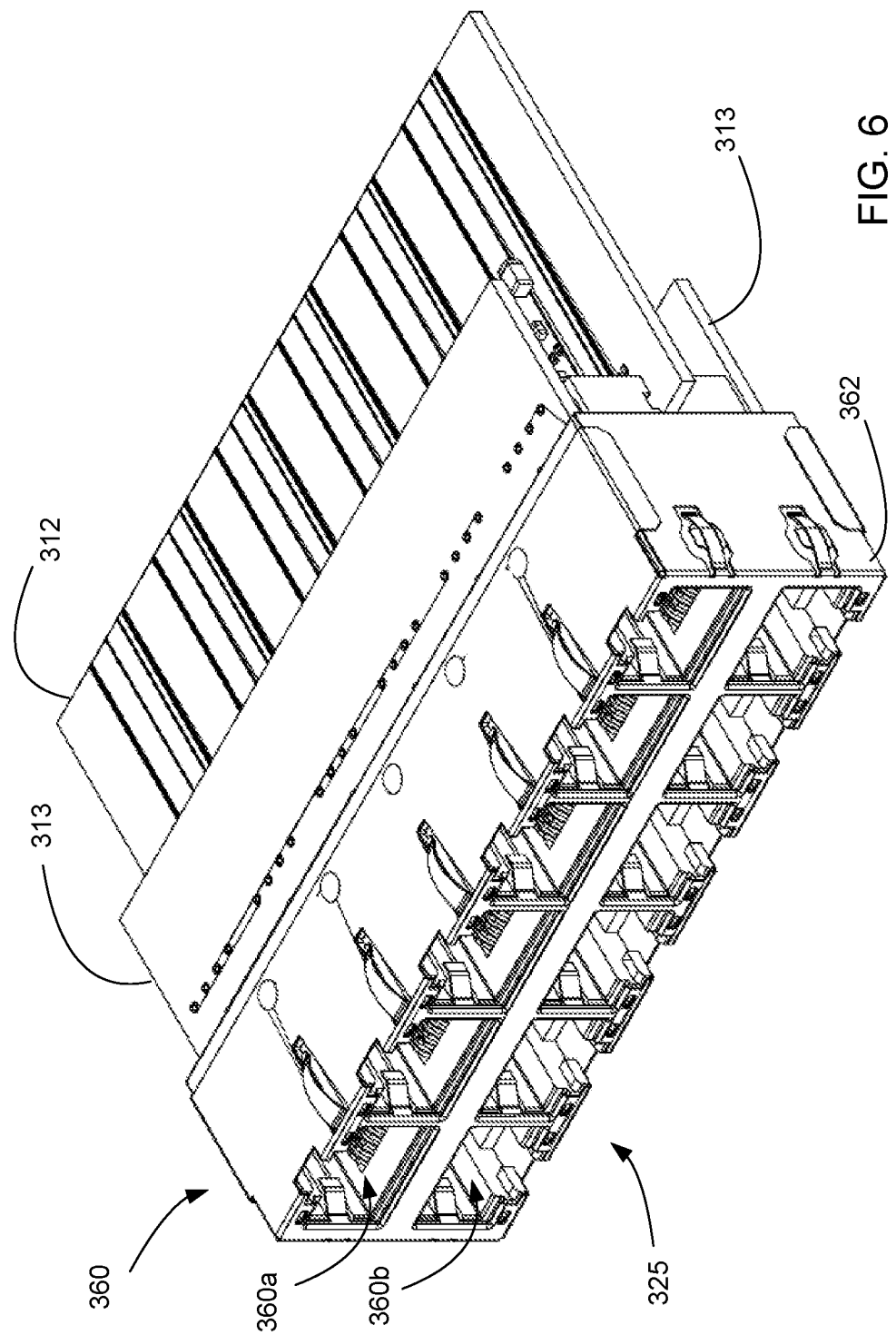
FIG. 6 illustrates a perspective view of an embodiment of a port module and a plurality of circuit boards.
Figure 7:
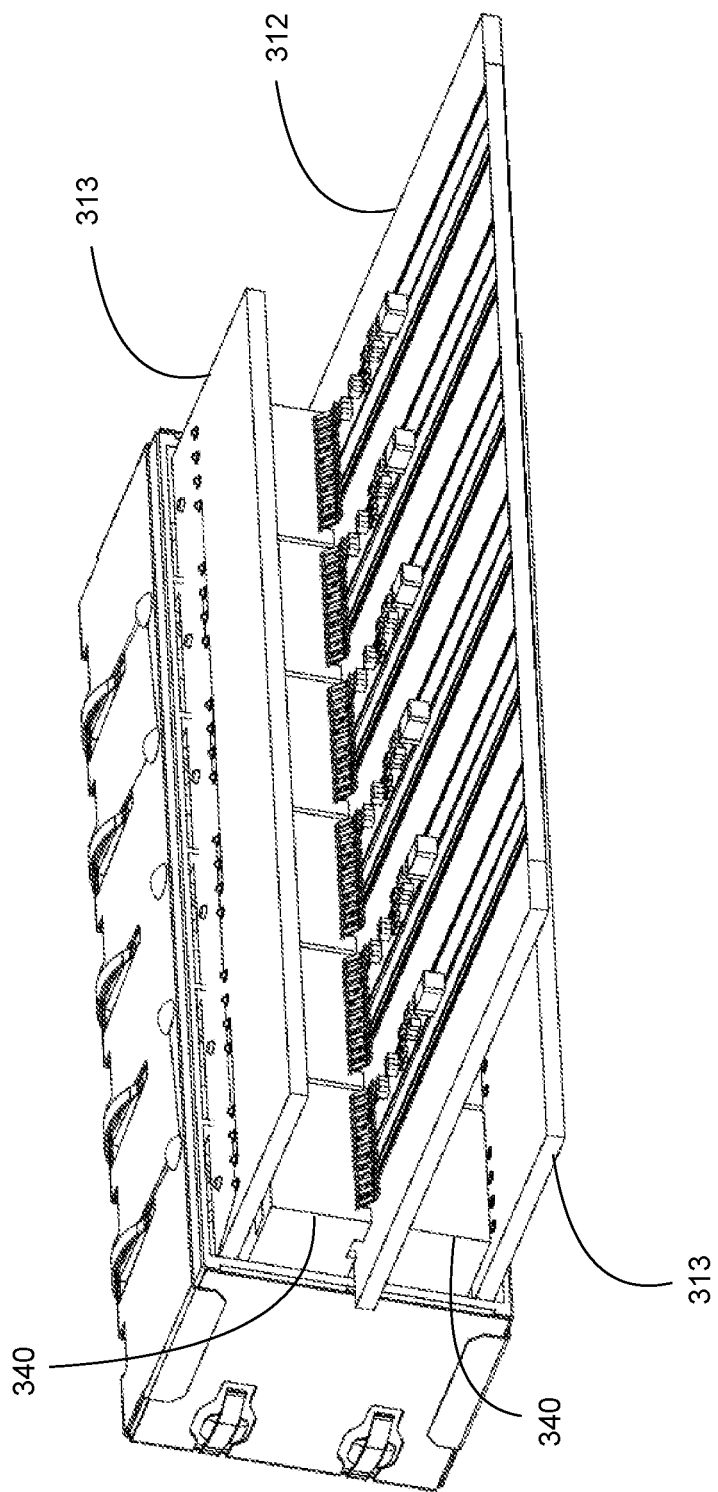
FIG. 7 illustrates another perspective view of the embodiment depicted in FIG. 6.
Figure 8:
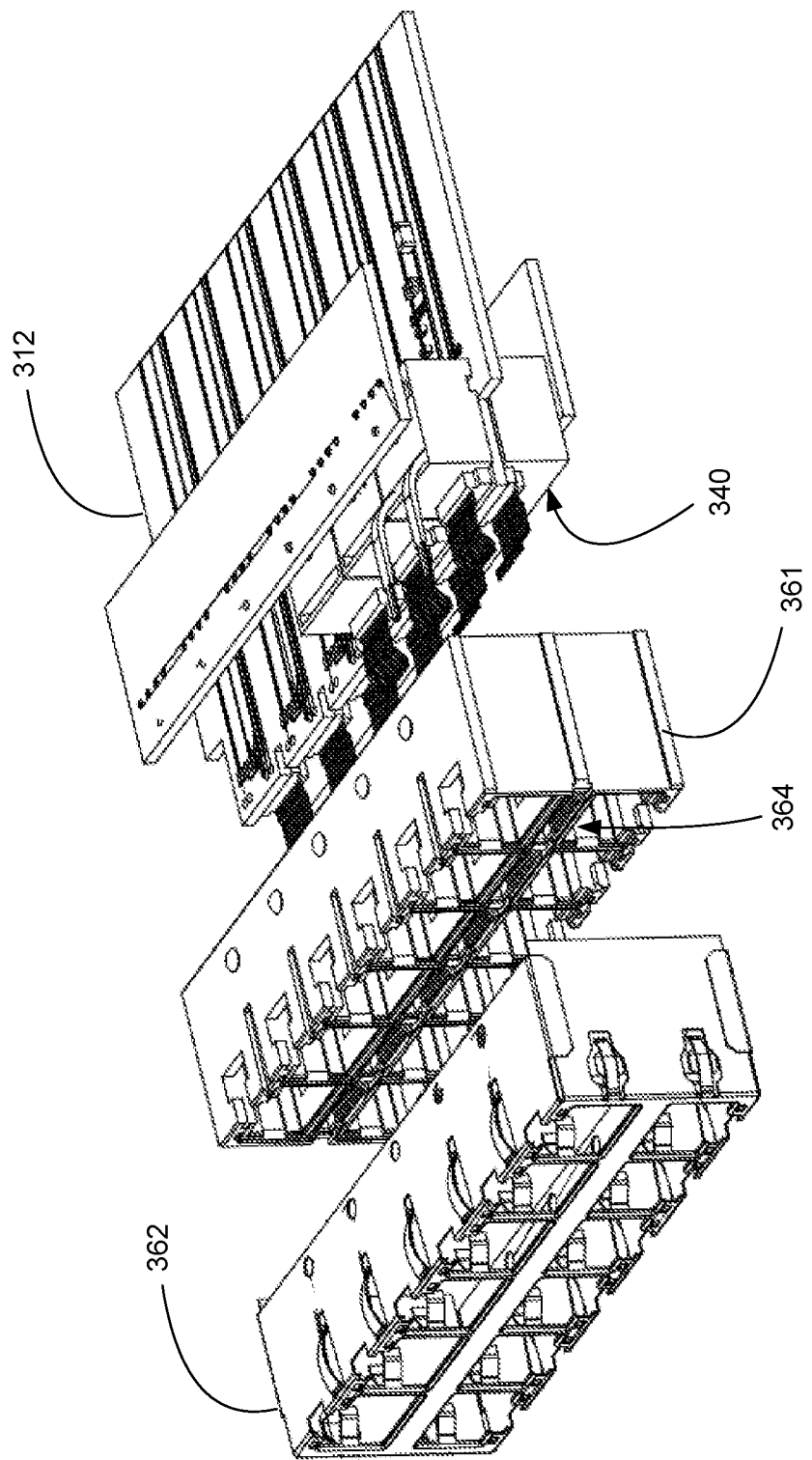
FIG. 8 illustrates a perspective exploded view of the embodiment depicted in FIG. 6.

FIG. 5 illustrates a schematic representation of an embodiment with a configuration that includes features of the port module 160 and PHY module 145 combined but in a particular physical configuration that has been determined to be beneficial for certain applications. As depicted, a card module 200 includes a first circuit board 202 is configured to support a contact and magnetics assembly 201 on a first side (and as depicted, optionally on a second side) and the first circuit board also supports a signal modulation circuit 206 (the signal modulation circuit is typically part of the PHY module 145). A communication connection 205 allows the signal modulation circuit 206 to communicate with an ASIC in a digital fashion while a voltage connection 208 is provided to support the signal modulation circuit 206.

The contact and magnetic assembly 201 includes a line interface 220 (which is typically part of a port module and can be an RJ45 connector or some other desirable interface) that is connected to magnetics 221. The magnetics 221 functions in a conventional manner and allows for communication of signals between the line interface 220 and a device interface 222 while providing some electrical isolation. As depicted, the line interface 220 terminates to a second circuit board 203 via a termination circuit 204, which can be any desired termination circuit. The device interface 222 is connected to the first circuit board 202 and thus to the signal modulation circuit 206. As can be appreciated, therefore, the line interface 220 can be electrically isolated from the first circuit board 202 even though the signal modulation circuit 206 is configured to provide signals to the line interface 220 via the magnetics 222.

One benefit of the depicted configuration is that the second circuit board 203 (which would be a third circuit board in a system where a separate circuit board was used for a IC module) can include power injection into the termination via a power connection 207 and in an embodiment the power can be inserted into the twisted pair via a termination circuit such as termination circuit 204 while ensuring there is good electrical isolation between the first circuit board 202 and the second circuit board 203 (as can be appreciated from the depicted embodiment, there can be two second circuit boards 203). This can potentially reduce the need for isolation capacitors and can, even if the isolation capacitors are used, allow for improved performance as the first circuit board 202 can be optimized for signal performance and/or made smaller without the need to compensate for electrical isolation.

The second circuit board 203 also includes a communication connection 205 and a regulation circuit 209. It should be noted that each circuit can include a connection to other components and thus the depicted configuration allows for wires/cables to be connected to the illustrated circuits.

As can be appreciated, the second circuit board 203 can be positioned on two sides of the first circuit board. Power for the provision of Power-over-Ethernet (POE) can be provided on the second circuit boards 203 and thus POE power can be kept separate from the first circuit board 202. Numerous benefits can be provided by the depicted configuration but in embodiments where POE is not required the POE boards can be omitted.

FIGS. 6-22 illustrate an exemplary configuration of the embodiment that is schematically represented in FIG. 5. It should be noted that the depicted embodiment does not show all the circuitry for purposes of brevity as the particular circuitry used will depend on the chips mounted on circuit board as well as the desired functionality and capabilities of the final assembly and the chip(s) being used. It should also be noted that circuitry is intended to be inclusive of any desirable configuration and could be, without limitation, an FPGA chip, a PHY module, a transceiver or any desirable combination of components and integrated circuits.

The depicted card module 325 includes a port module 360 that includes a housing 361 with a cage 362 that at least partially extends around a perimeter of the housing 361. The port module 360 defines upper ports 360a and lower ports 360b. Typical front module assemblies will include a plurality of ports in a stacked and ganged configuration (as depicted) and it should be noted that a port module can readily include more or less than the depicted 6 ports and in alternative embodiments the configuration may not include stacked ports. As can be appreciated, one benefit of the stacked configuration is the ability to reduce costs compared to a pure ganged configuration, as will be discussed further below.

The depicted card module 325 includes a first circuit board 312 and two second circuit board 313. The first circuit board 312 can include circuitry 316 that receives and transmits signals and thus the circuitry 316 will typically include a PHY module as well as other desirable chips and components (such as a media independent interface chip or microcontroller) used to filter and modify received and sent signals, as well as to communicate with the digital part of the system. In the depicted configuration the first circuit board does not include Power over Ethernet (POE) elements and instead the power insertion circuitry (which can be conventional POE circuitry) and any desired termination circuitry (such as the termination known as the Bob-Smith termination) can be included on the second circuit boards 313. As can be appreciated, such a configuration allows the power insertion componentry and higher voltage touching components to be provided on the second circuit board 313, thus allowing for a simpler layout on the first circuit board 312. A cable connection (not shown), such as power communication assembly 191 depicted in FIG. 3C, can be included as desired to provide power to the second circuit board 313. While not shown for purposes of brevity, the first circuit board 312 will also include a signal communication assembly 190 to allow the first circuit board 312 to communicate with a processor provided on another circuit board.

Figure 9:
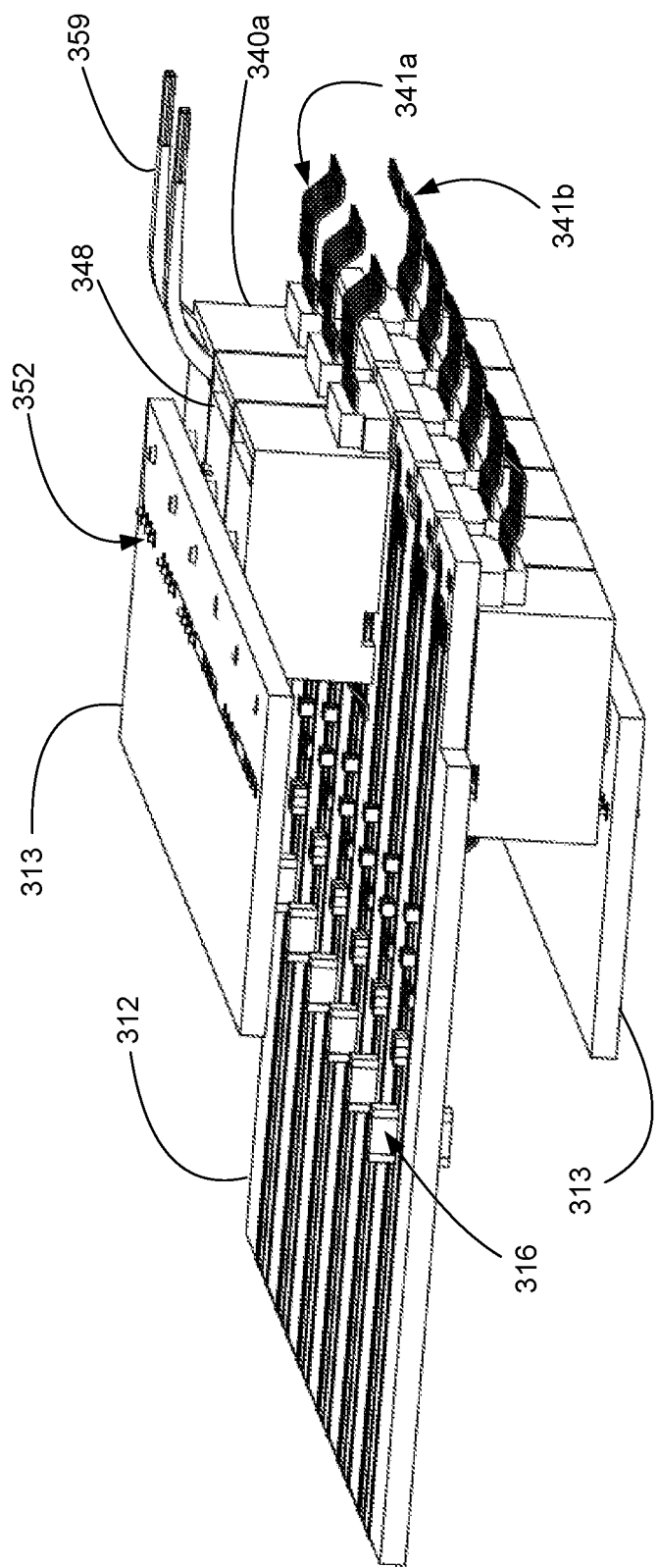
FIG. 9 illustrates a simplified perspective view of the embodiment depicted in FIG. 6.
Figure 10:
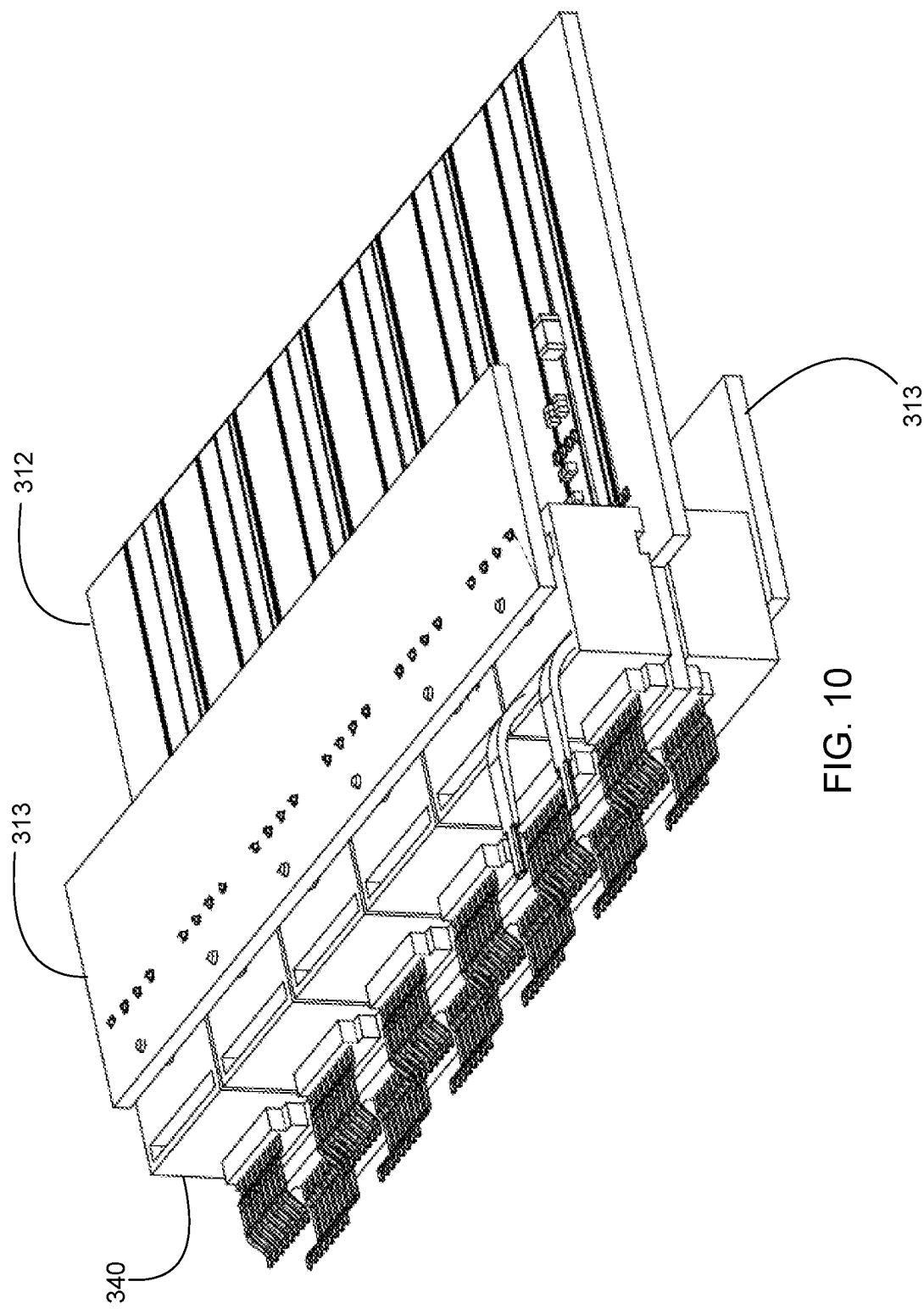
FIG. 10 illustrates another perspective view of the embodiment depicted in FIG. 9.
Figure 11:
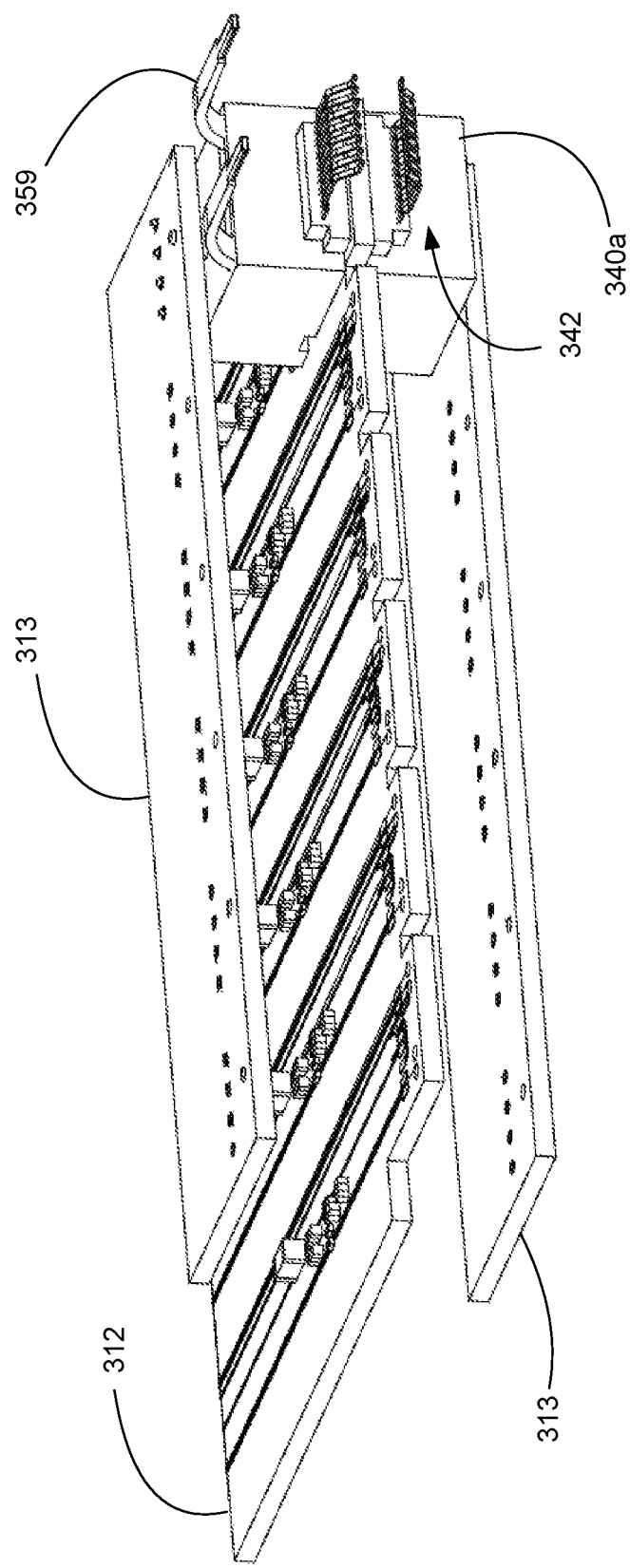
FIG. 11 illustrates a simplified perspective view of the embodiment depicted in FIG. 9.
Figure 12:
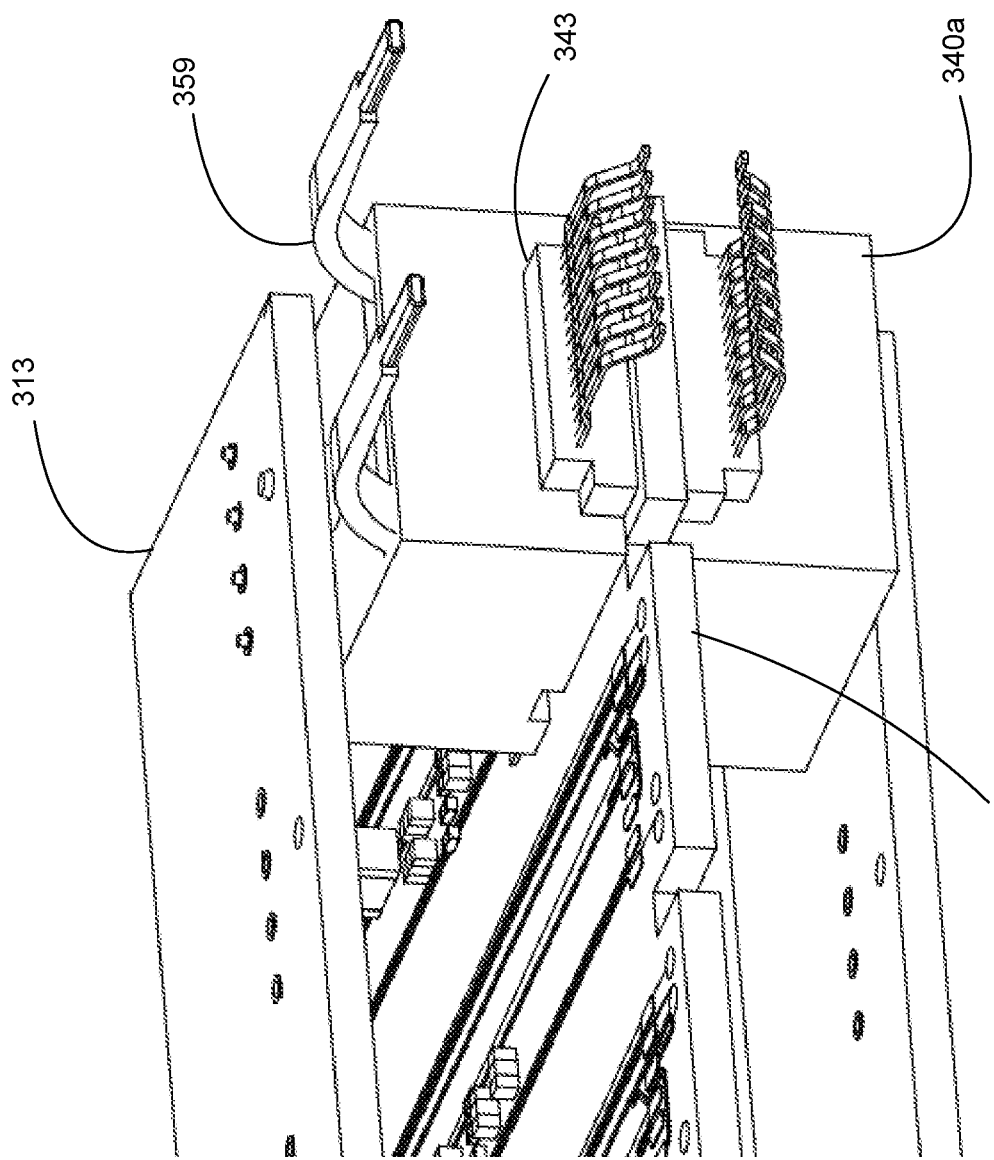
FIG. 12 illustrates an enlarged perspective view of the embodiment depicted in FIG. 11.
Figure 13:
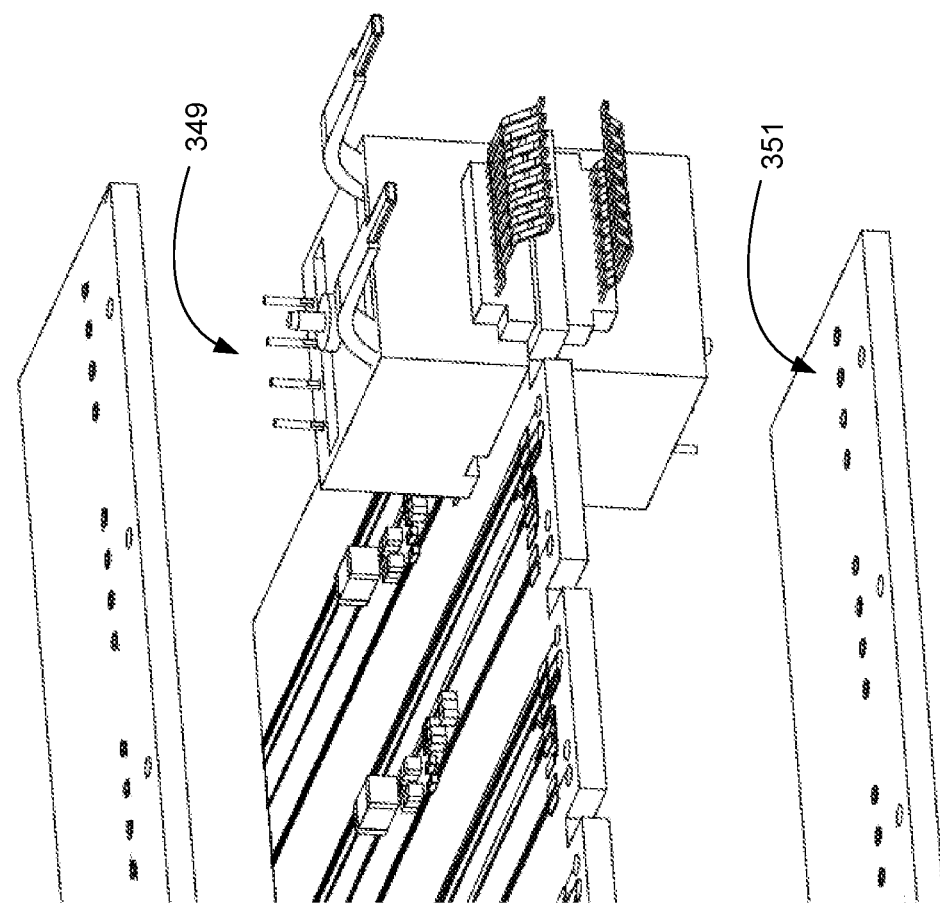
FIG. 13 illustrates a partially exploded perspective view of the embodiment depicted in FIG. 12.
Figure 14:
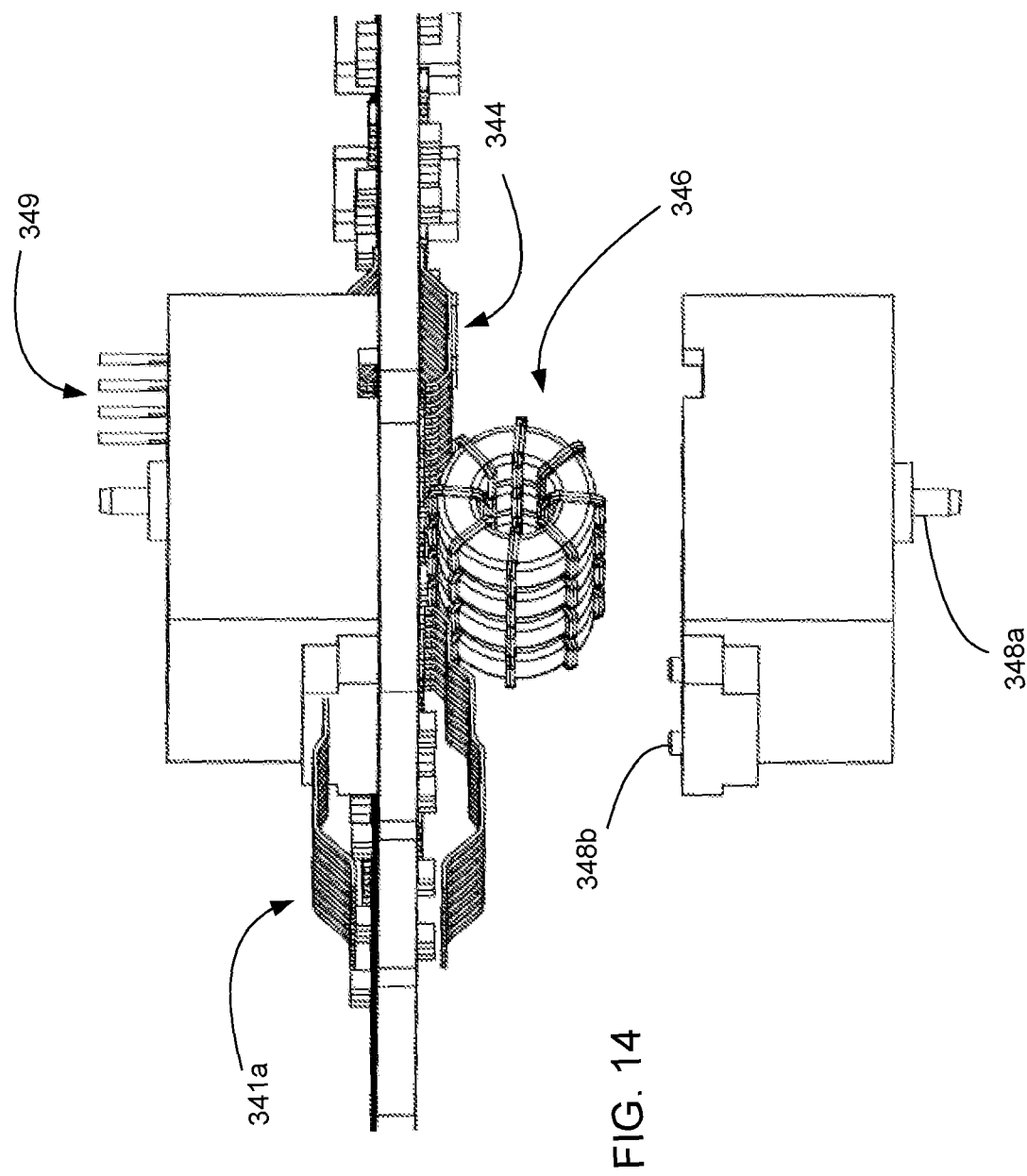
FIG. 14 illustrates an exploded perspective view of an embodiment of a transformer box mounted on a circuit board.
Figure 15:
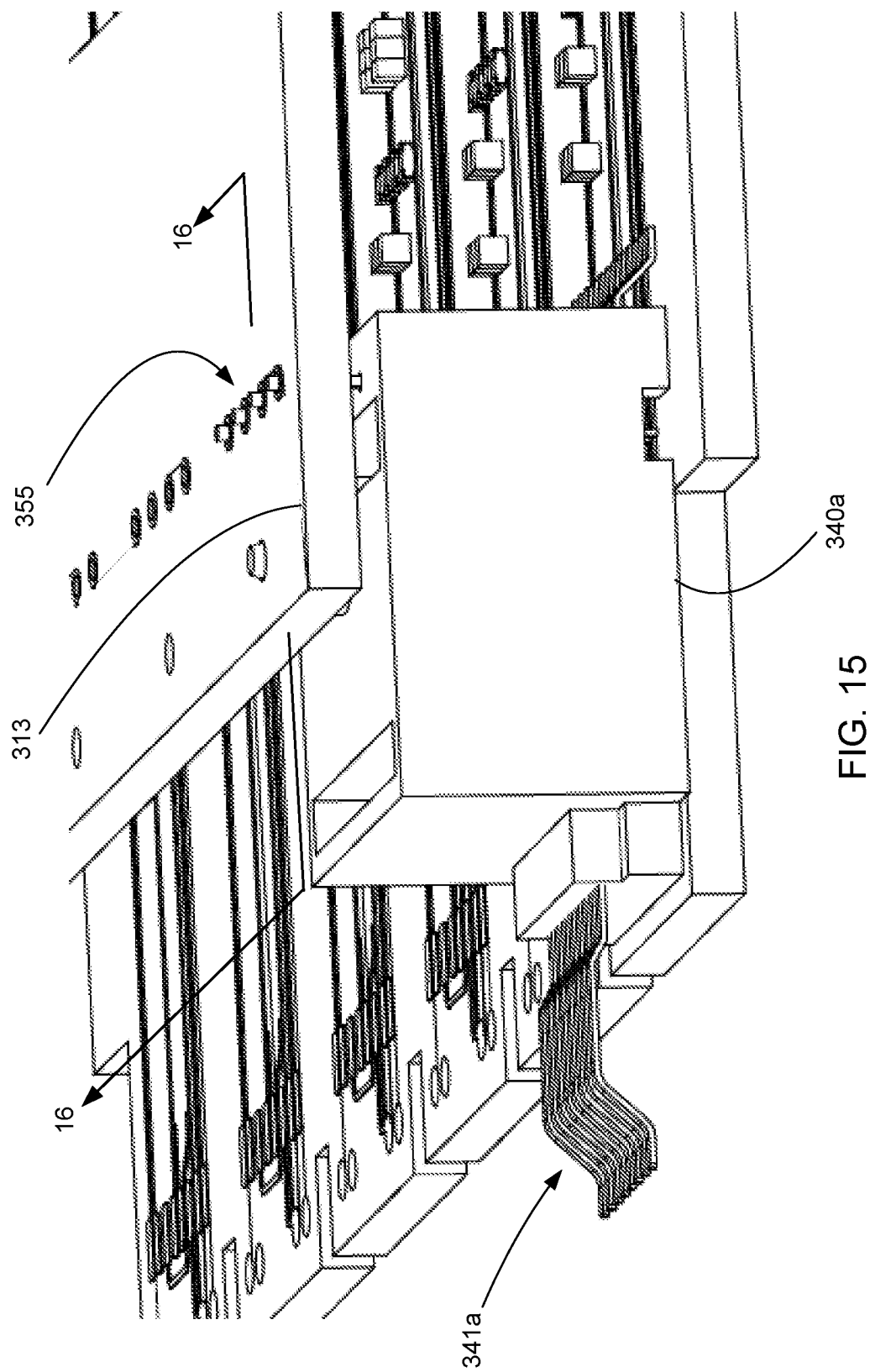
FIG. 15 illustrates a simplified perspective view of the embodiment depicted in FIG. 12.
Figure 16:
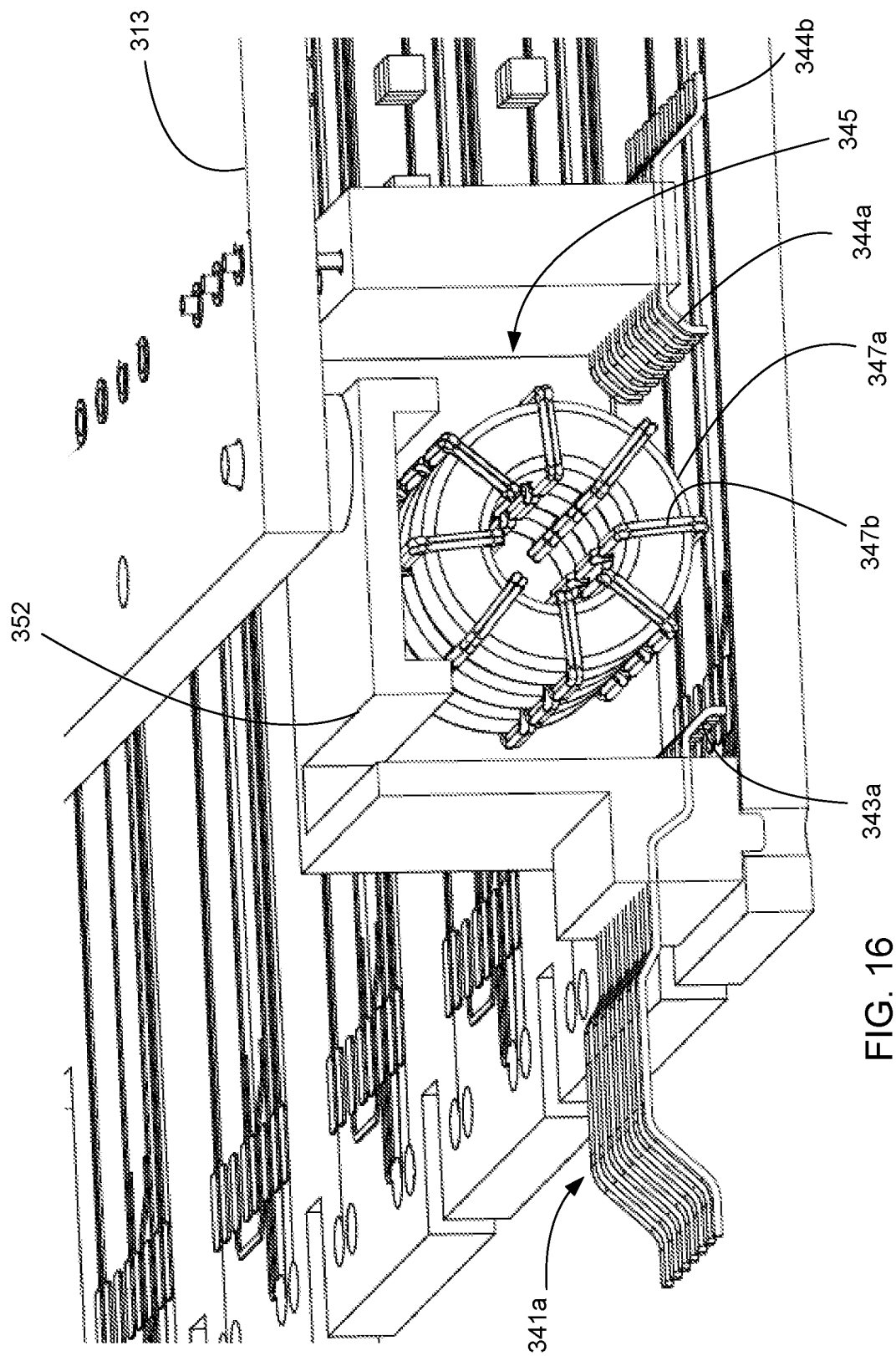
FIG. 16 illustrates a perspective cross-sectional view of the embodiment depicted in FIG. 15, taken along line 16-16.
Figure 17:
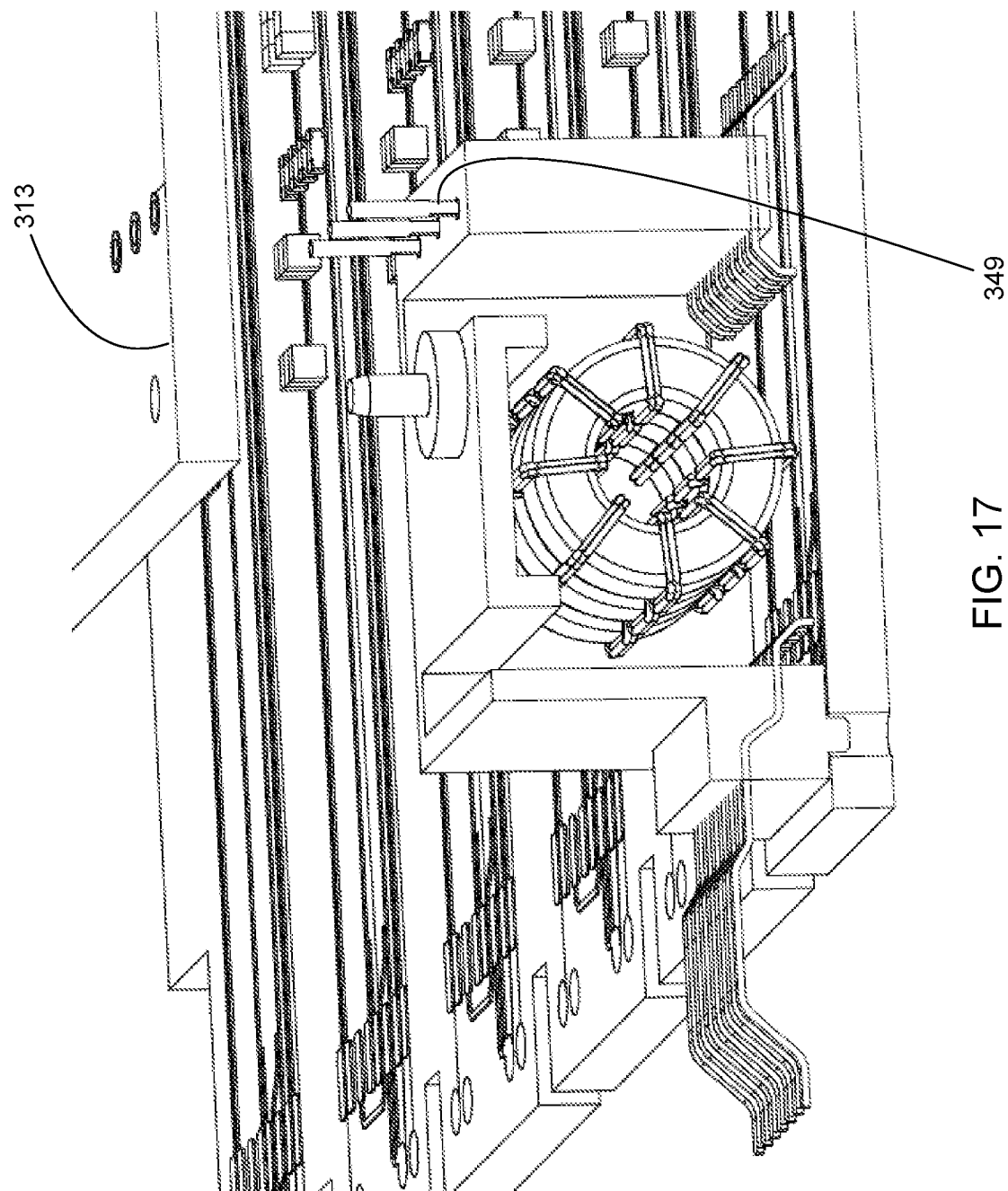
FIG. 17 illustrates a partially exploded perspective view of the embodiment depicted in FIG. 16.
Figure 18:
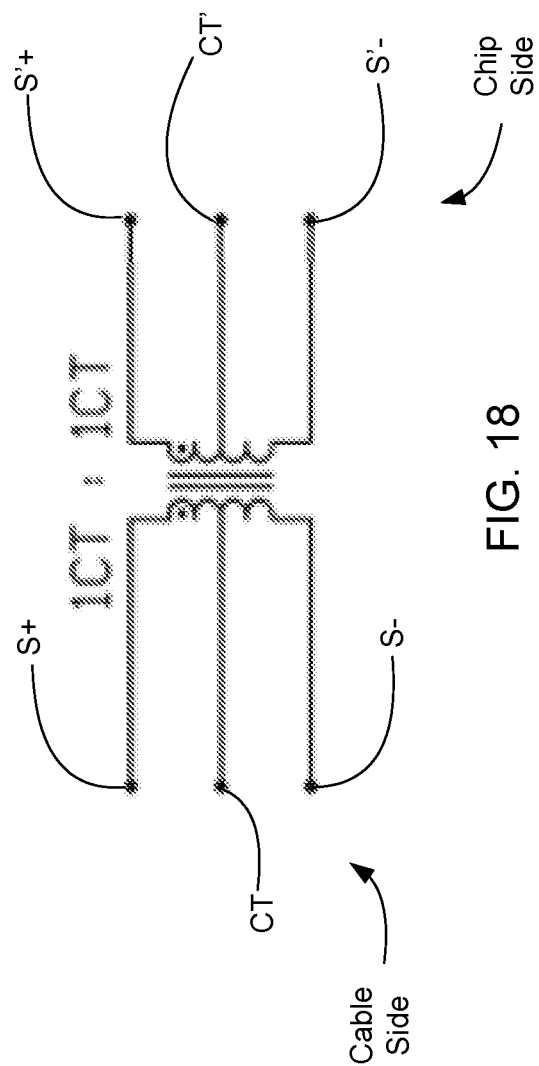
FIG. 18 illustrates a schematic representation of an embodiment of a transformer.
Figure 19:
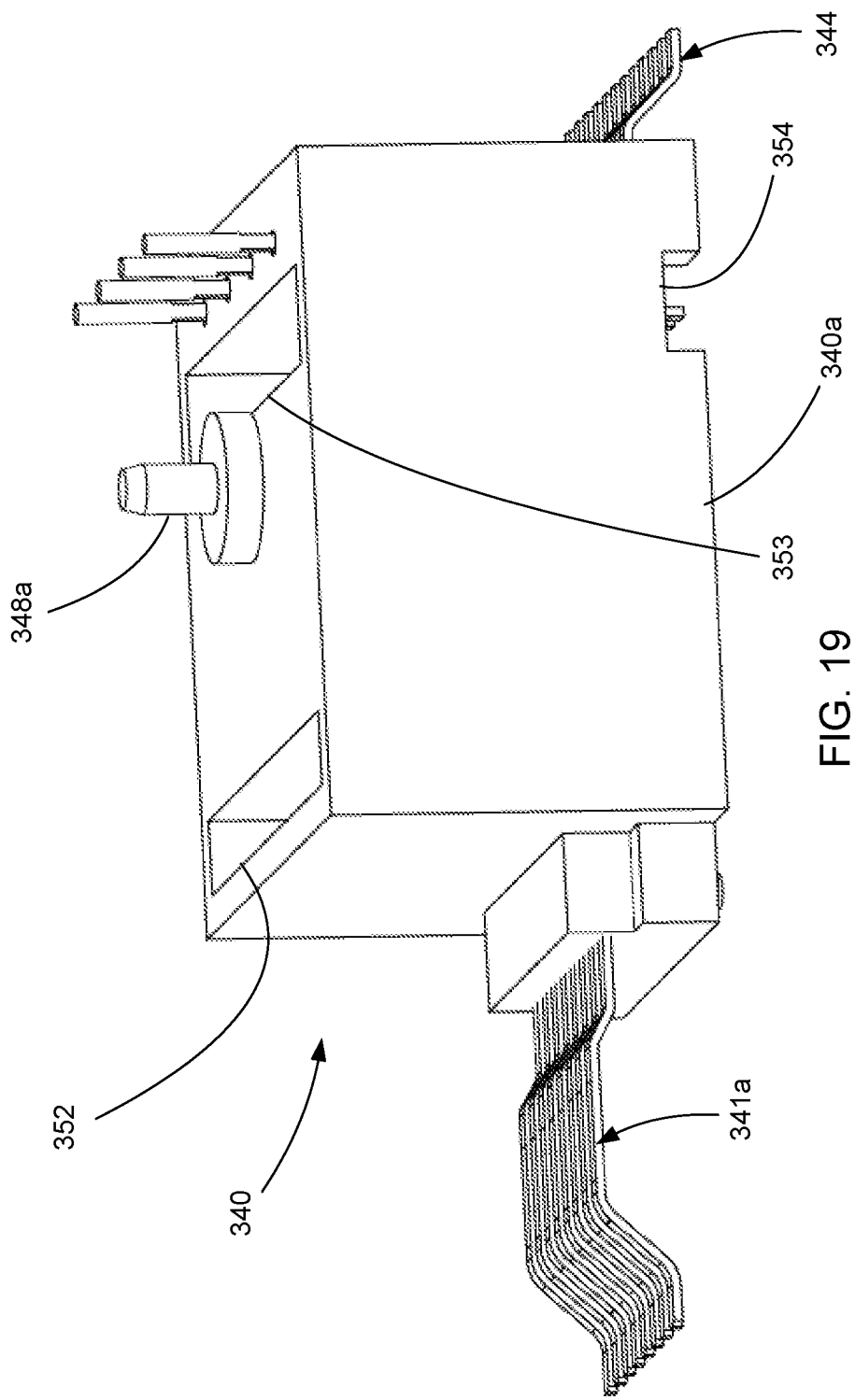
FIG. 19 illustrates a perspective view of an embodiment of a transformer box.
Figure 20:
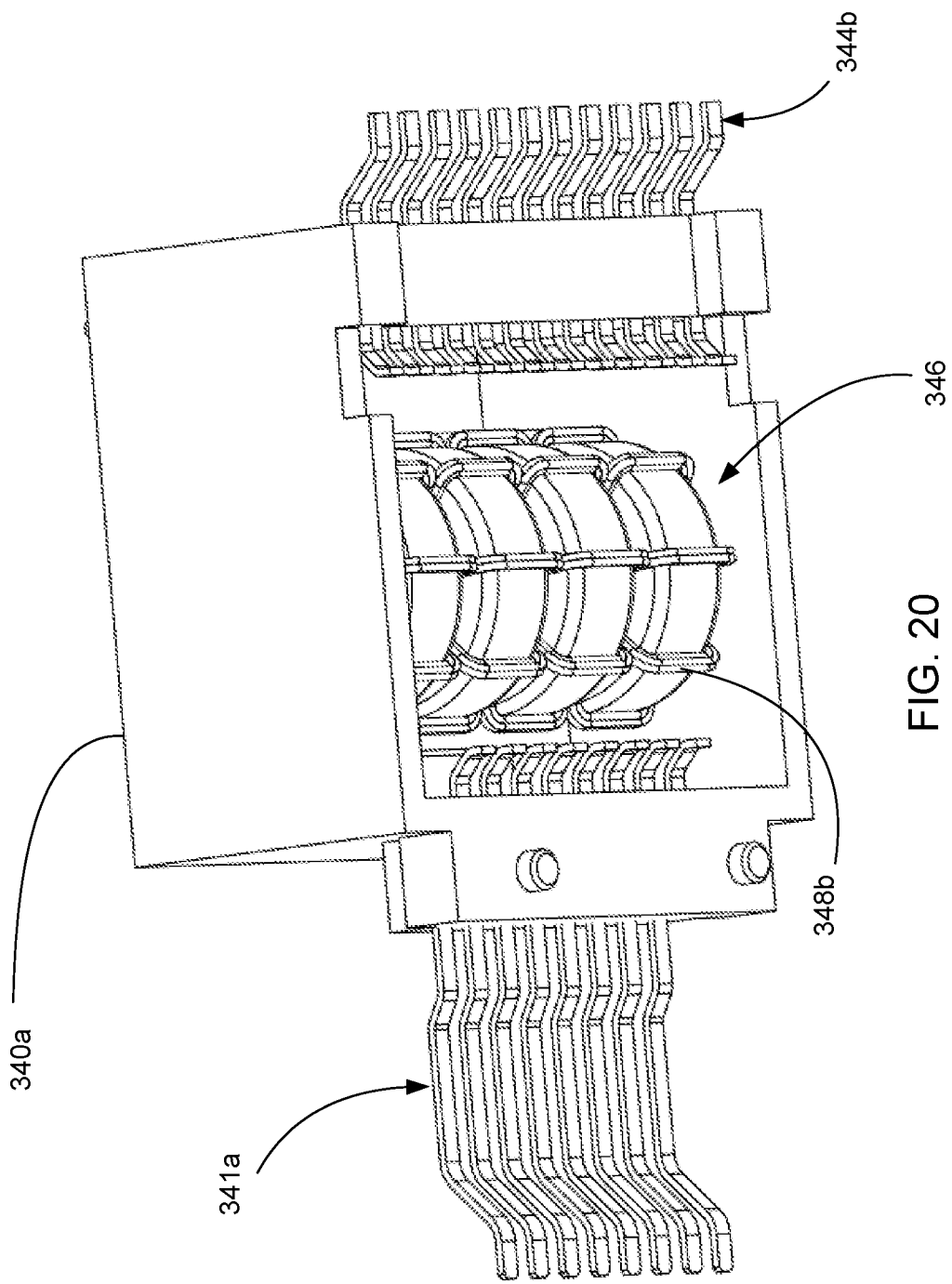
FIG. 20 illustrates another perspective view of the embodiment depicted in FIG. 19.
Figure 21:
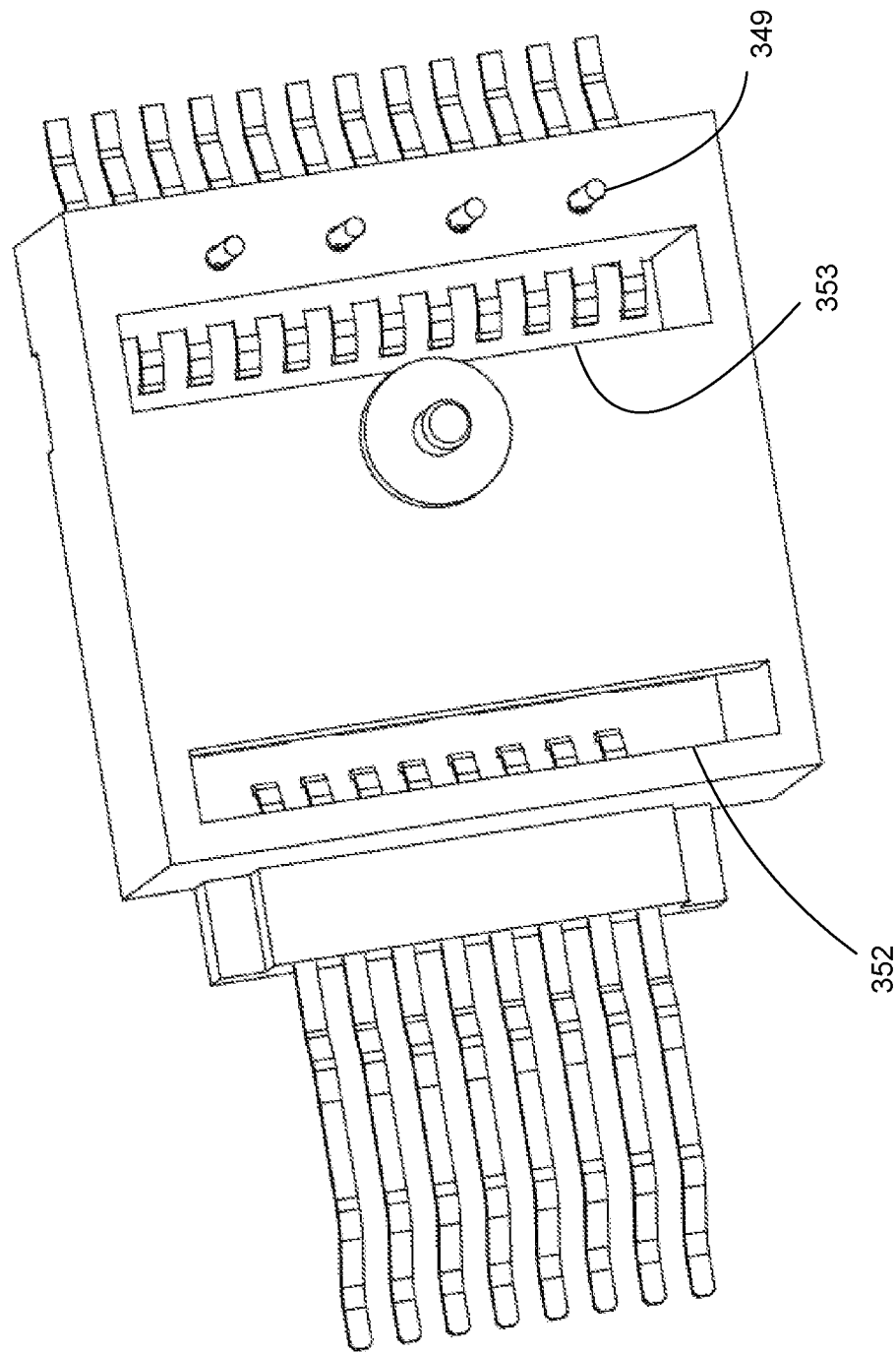
FIG. 21 illustrates another perspective view of the embodiment depicted in FIG. 19.

As can be appreciated, the first circuit board 312 supports a transformer box 340. In a ganged configuration a plurality of transformer boxes 340 can be positioned side-by-side on the first circuit board 312. In a ganged configuration, transformer boxes 340 can be positioned on two sides of the first circuit board (such as is depicted in FIG. 9). Each transformer box 340 includes transformer housing 340a and a terminal frame 343 that supports a first terminal set 341a, 341b and the transformer boxes, if desired, can be configured the same on both sides of the first circuit board 312. As depicted, the first terminal sets 341a, 341b provide a row of terminals 342 and the terminal frame 343 is integral with the transformer housing 340a. In an embodiment the row of terminals 342 is positioned in a comb 364 provided by the housing 361 but such a construction is not required. The transformer box 340 can optionally support one or more light pipes 359 and a corresponding light emitting diode (LED) can be positioned on the circuit board 312 so that the LED is covered by the transformer box 340.

The transformer box 340 supports a plurality of transformers 346 that are used to pass the signals received from the first terminal sets 341a, 341b (from a line side) to second terminal sets 344 (e.g., to a chip side) that can be connected to a chip (such as a chip in a PHY module) on the circuit board 312. The first terminal set 341a includes tails 343a that can be connected to wires. As can be appreciated, the transformer box 340 includes an interior 345 and is depicted as providing a transformer 346 (which includes a ferrite core 347a and windings 347b) that magnetically couples the signal wires connected to the tails 343a of first terminal set 341a, 341b to signal wires that are connected to tails 344a of the second terminal set 344. The second terminal set 344 also includes solder tails 344b that can be soldered to the circuit board 312. The transformer box 340 also includes board retention members 348a, 348b that can be used to secure the transformer box 340 to the respective circuit boards 312, 313.

If desired, the transformer box 340 could be increased in size and also used to support one or more filtering components. The transformer box 340 is also depicted as including termination pins 349, which are configured to engage vias 355 in the second circuit board 313. The termination pins 349 can be connected to a centertap of each pair of wires and can provide, in combination on the second circuit board 313 a Bob-Smith termination or some other desirable termination (as noted above). Thus the termination pins 349 can be connected to the centertap CT in FIG. 18 on the cable side (which naturally allows for power insertion into the transformer by applying a voltage to the centertap CT). Such a voltage, as is known, is electrically separated from the centertap CT' (which is on the chip side) and thus the chip side (S'+, S'−, CT') does not require high voltage separation (such as could be provided by a 2 kV capacitor). As the use of transformers for signal coupling and power insertion compatible with POE standards is well known, no further discussion will be provided herein. As can be appreciated, the depicted configuration allows for the termination of the line side signals to be done on the second circuit board 313 while the signals are pass through the transformer so as to be provided/passed to traces on the first circuit board (for eventual connection to a PHY module). Naturally, if the second board is not provided (because, for example, POE is not desired or if POE is included in the main circuit board) then the termination could also occur on the first circuit board 312 but such a configuration may require more space on the first circuit board 312.

The depicted transformer box 340 includes a front aperture 352 and a rear aperture 353. It has been determined that the inclusion of the front and rear apertures 352, 353 are beneficial in forming the transformer box 340 as it allows the first set of terminals 341a and the second sets of terminals 344 to be insert-molded into the transformer housing 340a (the apertures provides a way to hold the terminals in the desired position). In an embodiment the first and second terminal sets each have their respective tails bent/extending away from the aperture aligned with the corresponding set of tails. In the event that it is desired, the transformer box can also include a notch 354 to allow for a channel of air communication through the transformer housing 340a at a location aligned with the tails 344a. This could be desirable, for example, if the tails 344a were also soldered to the circuit board 312. It should be noted that once the internal components of the transformer box 340 are electrically connected together the internal components can be epoxied or potted in place to help secure and protect the wires/ferrite core used to provide the desired functionality.

Figure 22:
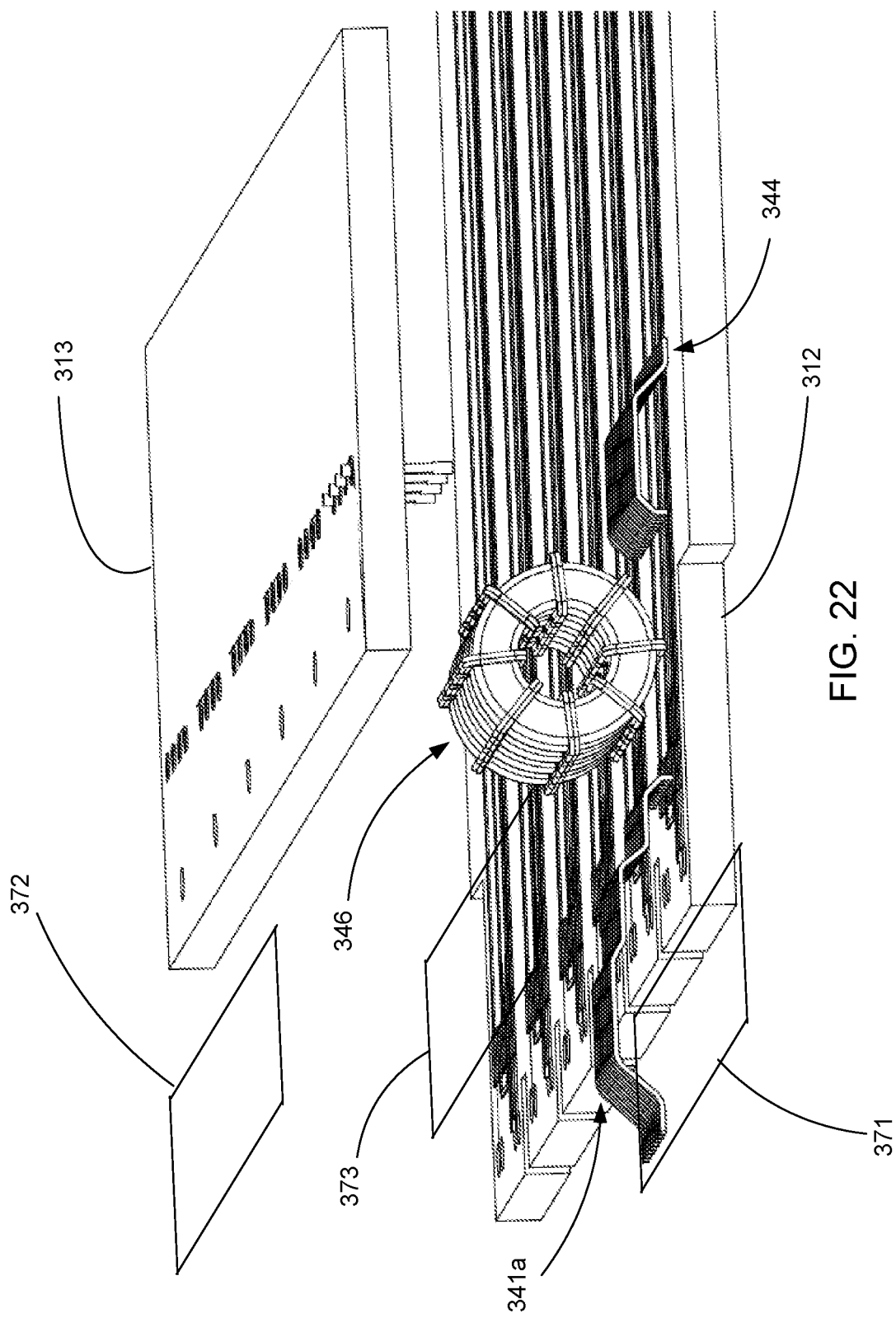
FIG. 22 illustrates a perspective simplified view of an embodiment of a port module and a plurality of circuit boards.
Figure 23:
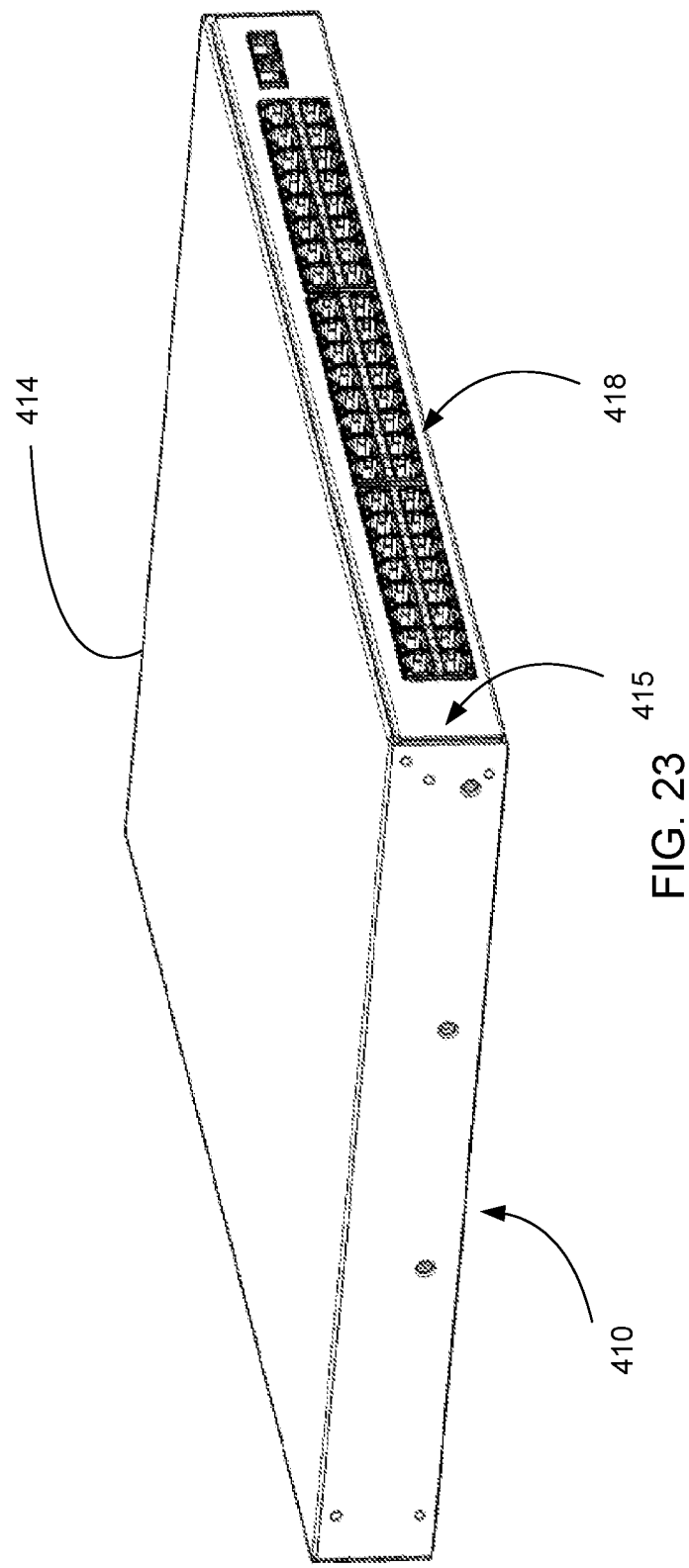
FIG. 23 illustrates a perspective view of another embodiment of a communication node.

As can be appreciated from FIG. 22, the first circuit board 312 and the second circuit board 313 are positioned on opposite side of a transformer 346 such that the first circuit board can define a first plane 371, the second circuit board 313 can define a second plane 372 and the transformer 346 can define a third plane 373, the third plane 373 being aligned with a center of the transformer 346, wherein each of the planes 371-373 are parallel to each other and the third plane 373 is parallel to the first plane 371 and between the first plane 371 and second plane 372. The transformer 346 includes a line side electrically connected to first terminal set 341 and includes a chip side electrically connected to terminal set 344. As can be appreciated, power can be inserted in the second plane 372 and thus the third plane 373 electrically connects the second plane 372 with the first plane 371 so that power can be supplied to the first terminal set 341a. The terminal set 344 is positioned on the first plane 371 and is electrically isolated from the first terminal set 341a. Thus, on the line side, power can be provided in the second plane 372, pass through the third plane 373 to the first plane 371 while being kept isolated from the chip side on the first plane 371.

Figure 24:
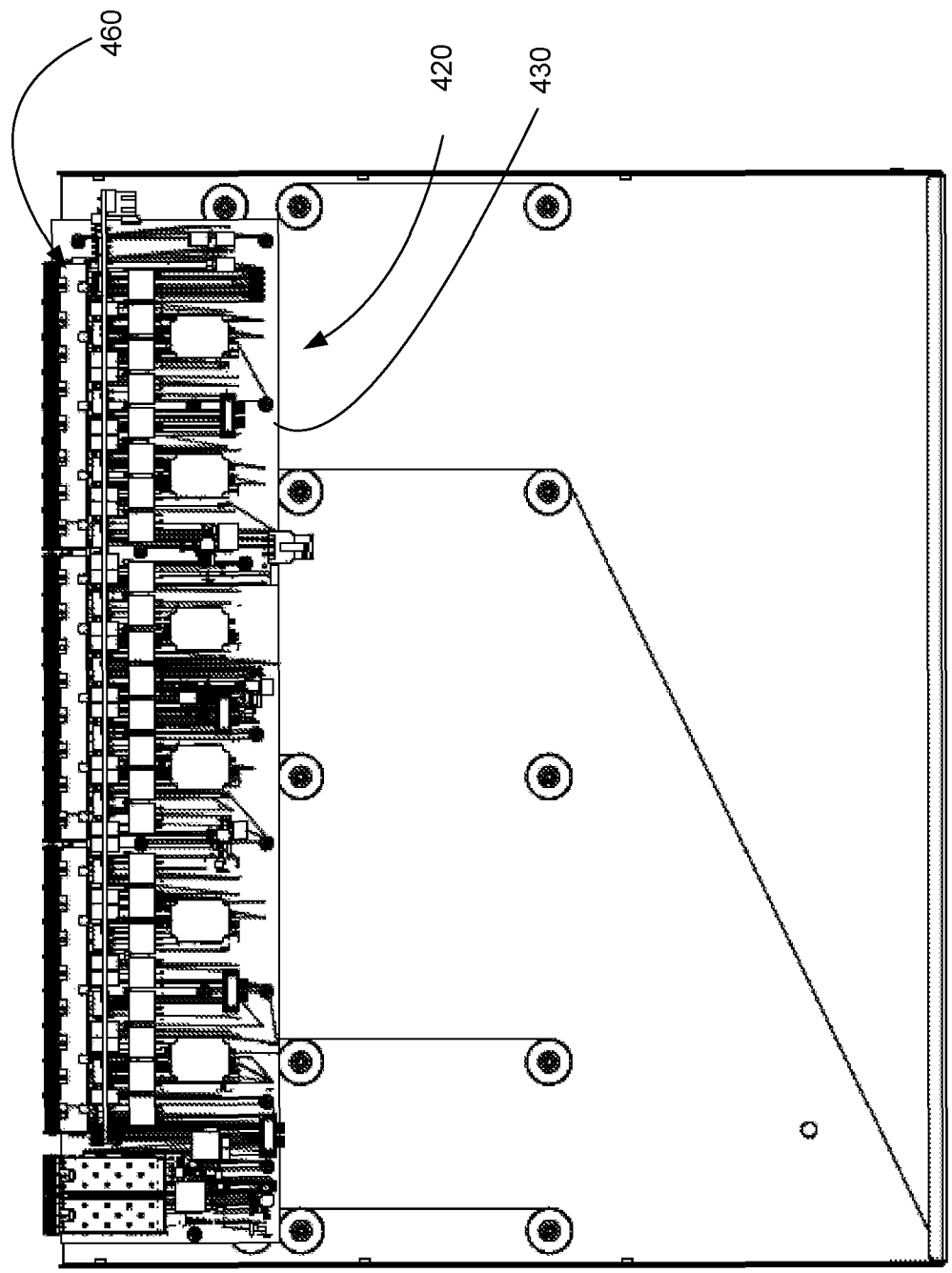
FIG. 24 illustrates a simplified plane view of the embodiment depicted in FIG. 23 with the top cover removed.
Figure 25:
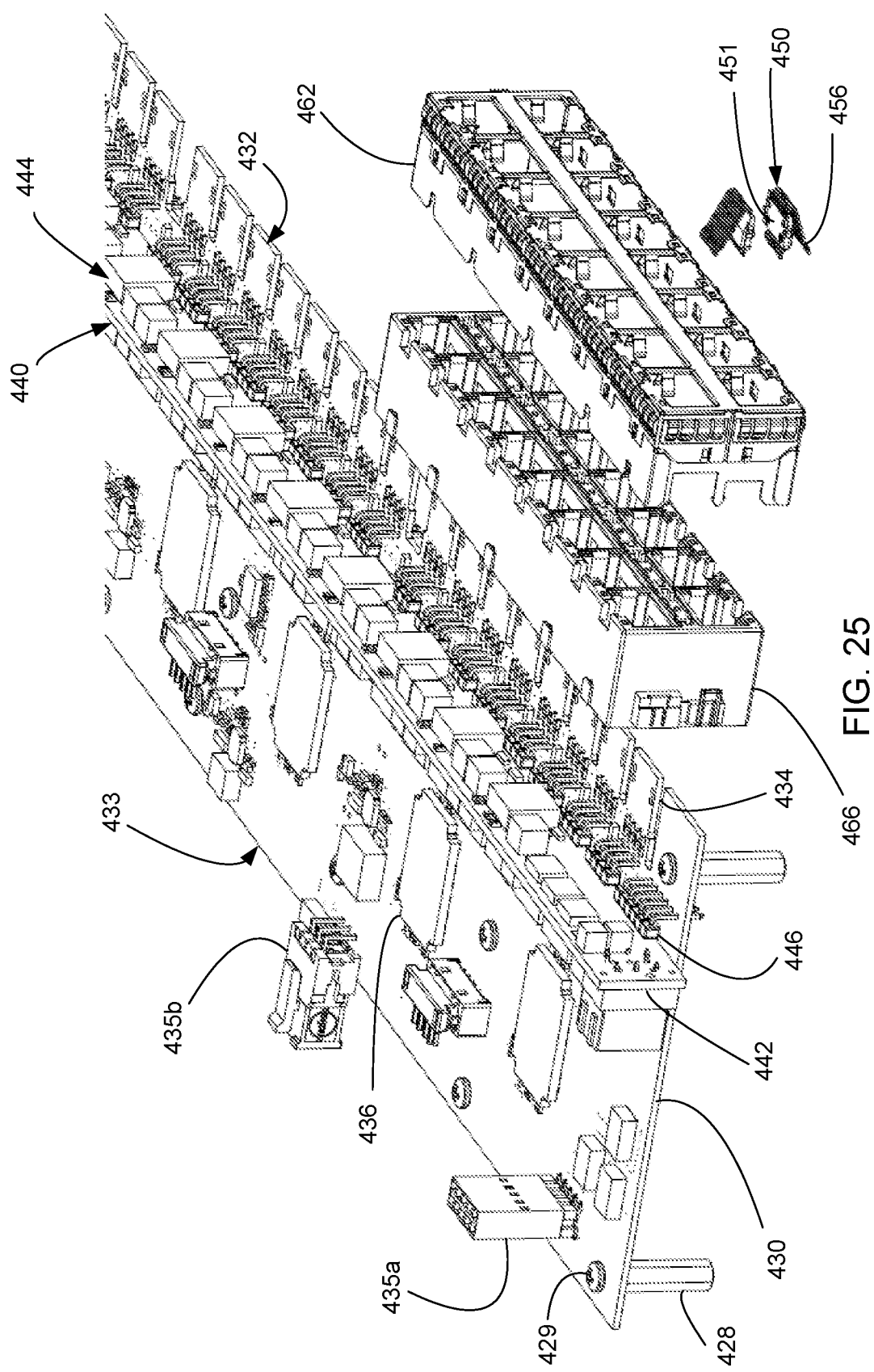
FIG. 25 illustrates a partially exploded perspective view of another embodiment of a card module.
Figure 26:
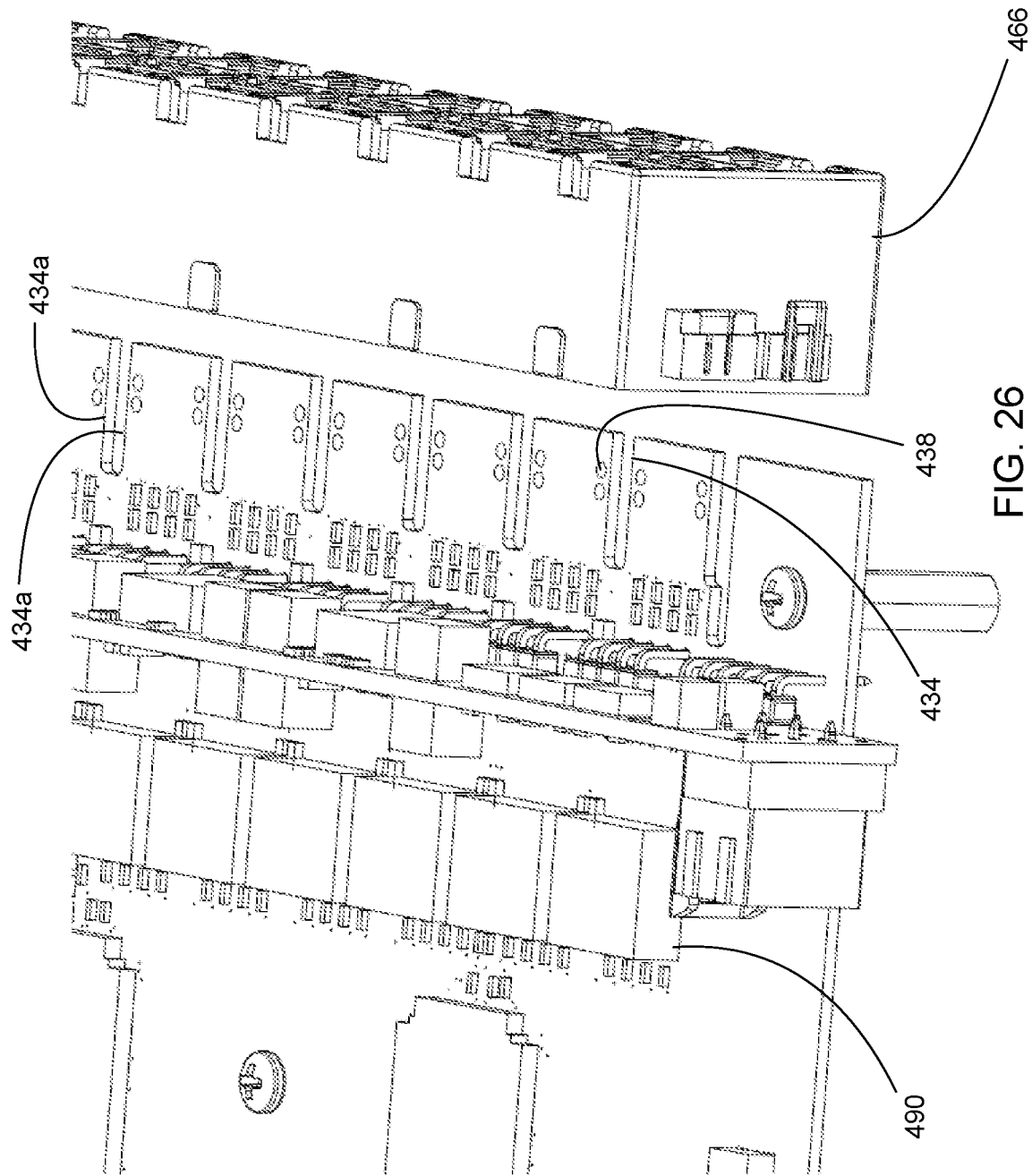
FIG. 26 illustrates a perspective simplified view of the embodiment depicted in FIG. 25.
Figure 27:
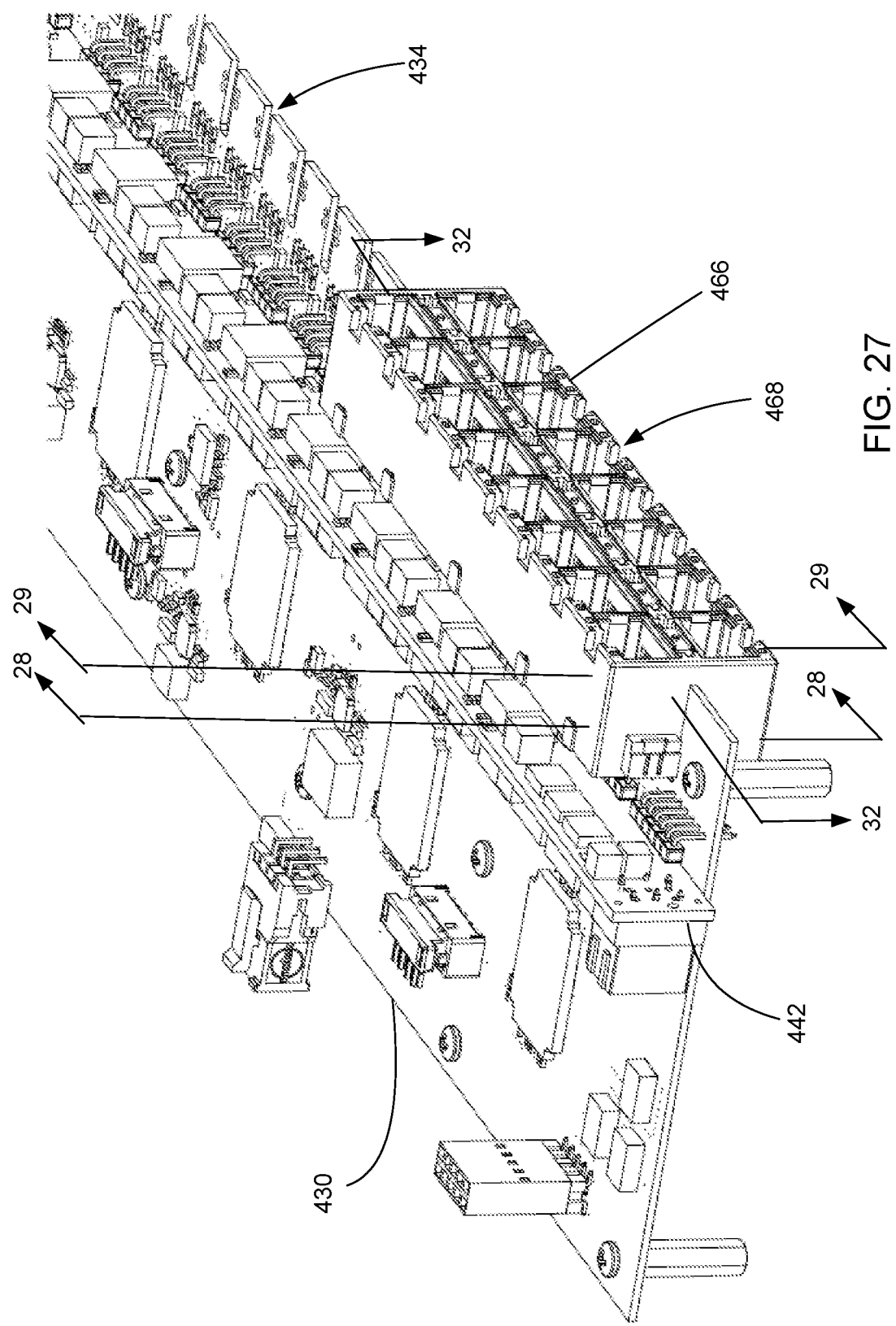
FIG. 27 illustrates a perspective of the embodiment depicted in FIG. 25 with a housing mounted on a circuit board.
Figure 28:
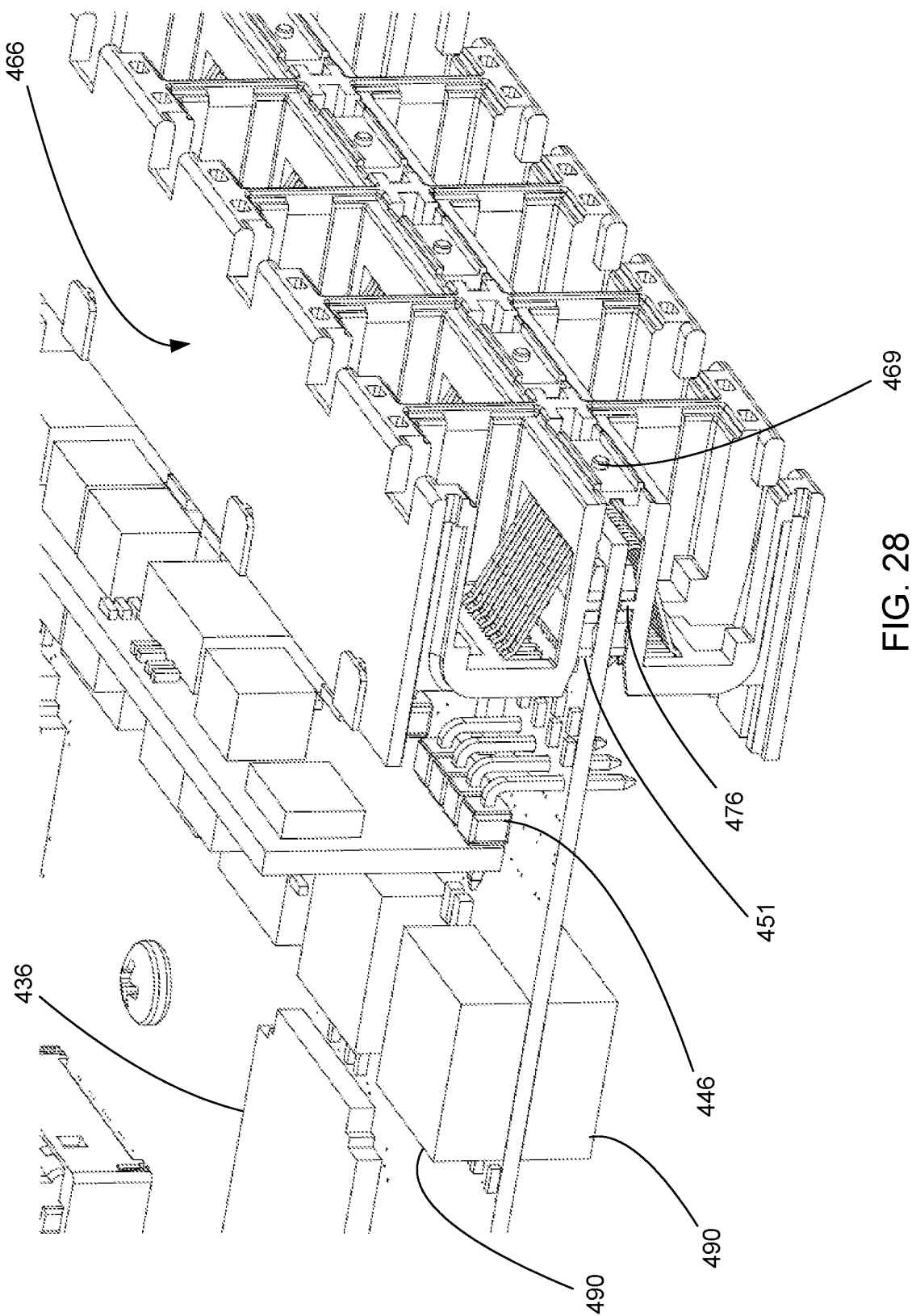
FIG. 28 illustrates a perspective cross-sectional view of the embodiment depicted in FIG. 27, taken along line 28-28.
Figure 30A:
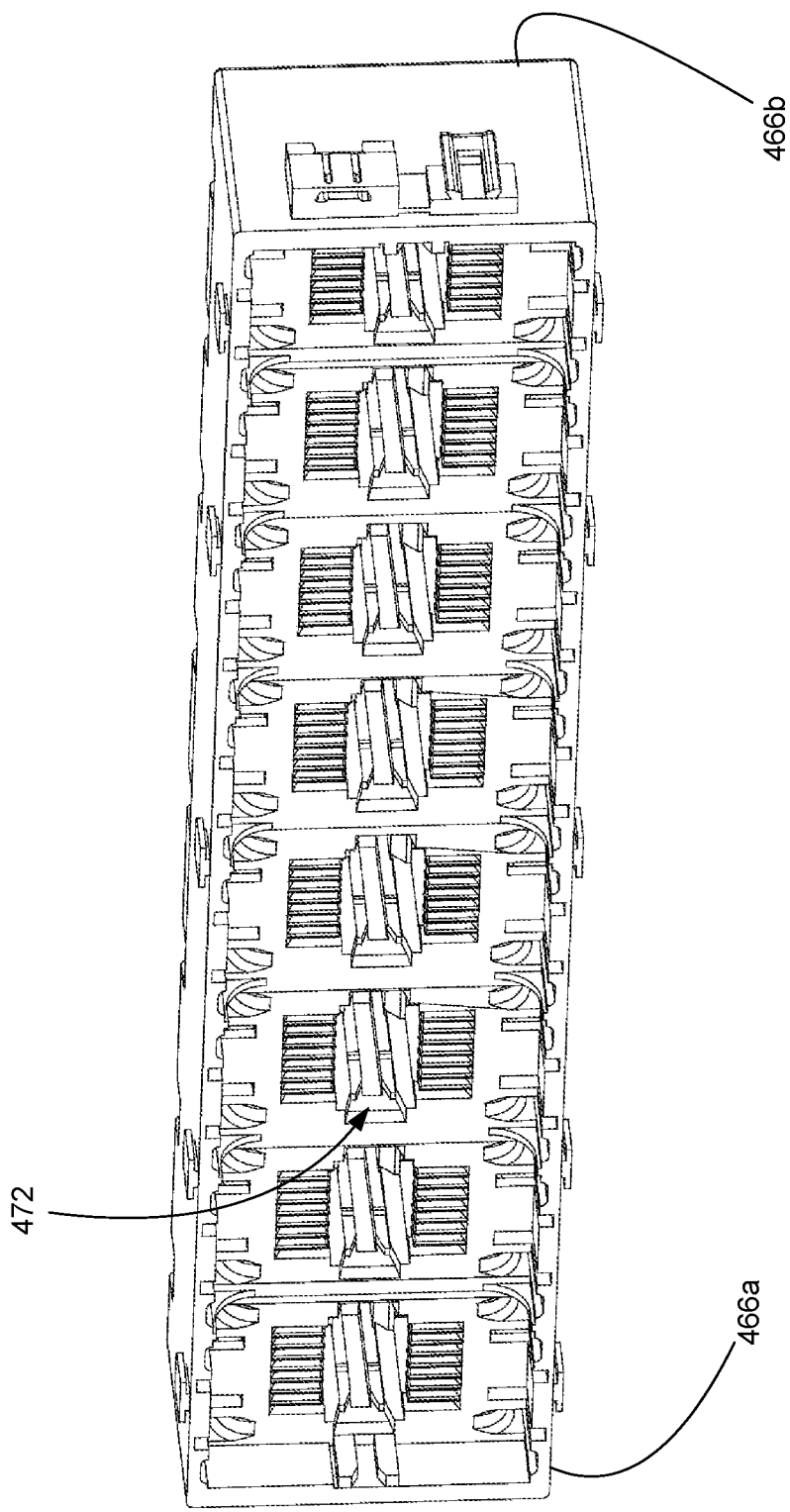
FIG. 30A illustrates a perspective view of an embodiment of a housing.
Figure 30B:
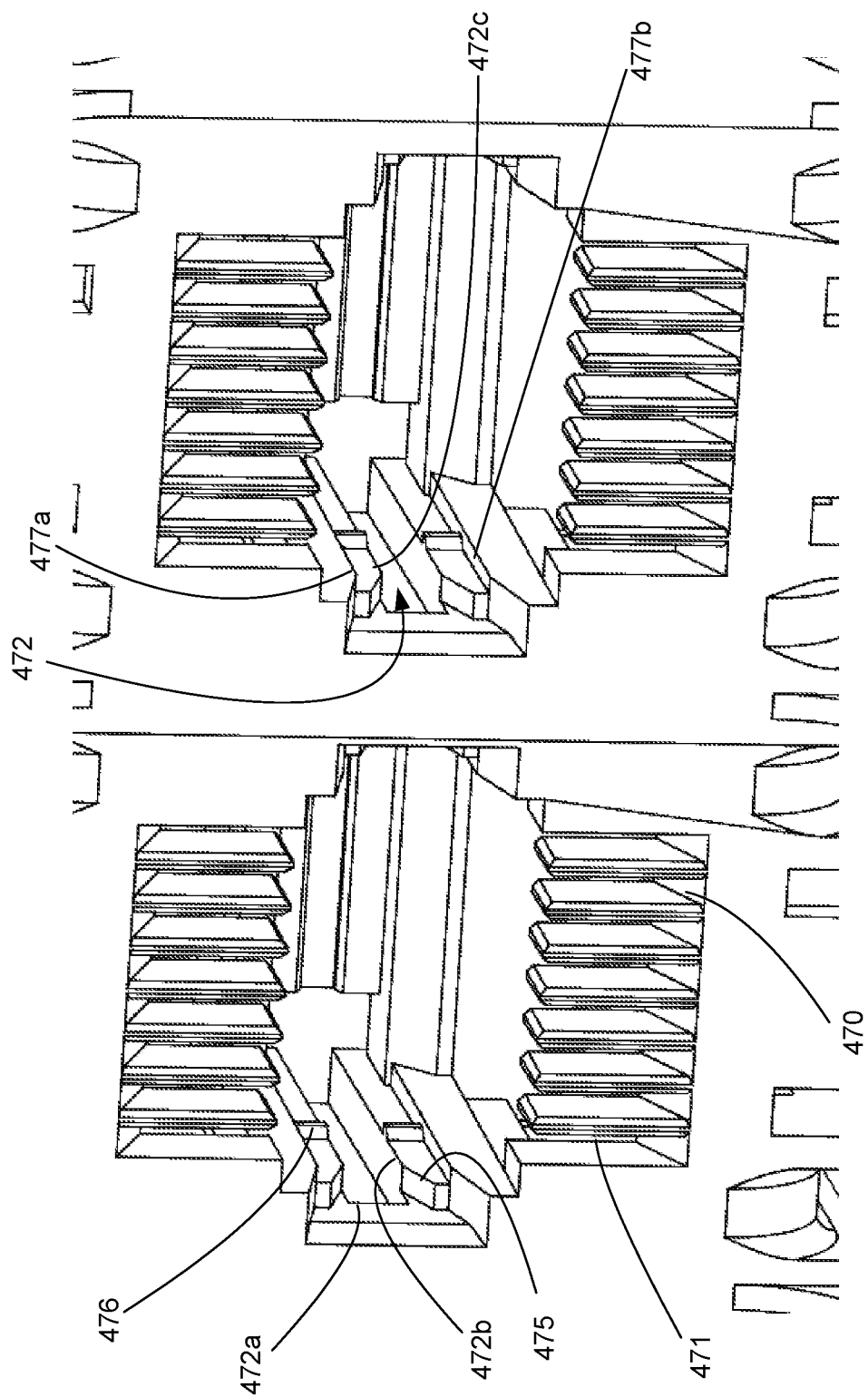
FIG. 30B illustrates an enlarged view of the embodiment depicted in FIG. 30A.
Figure 31:
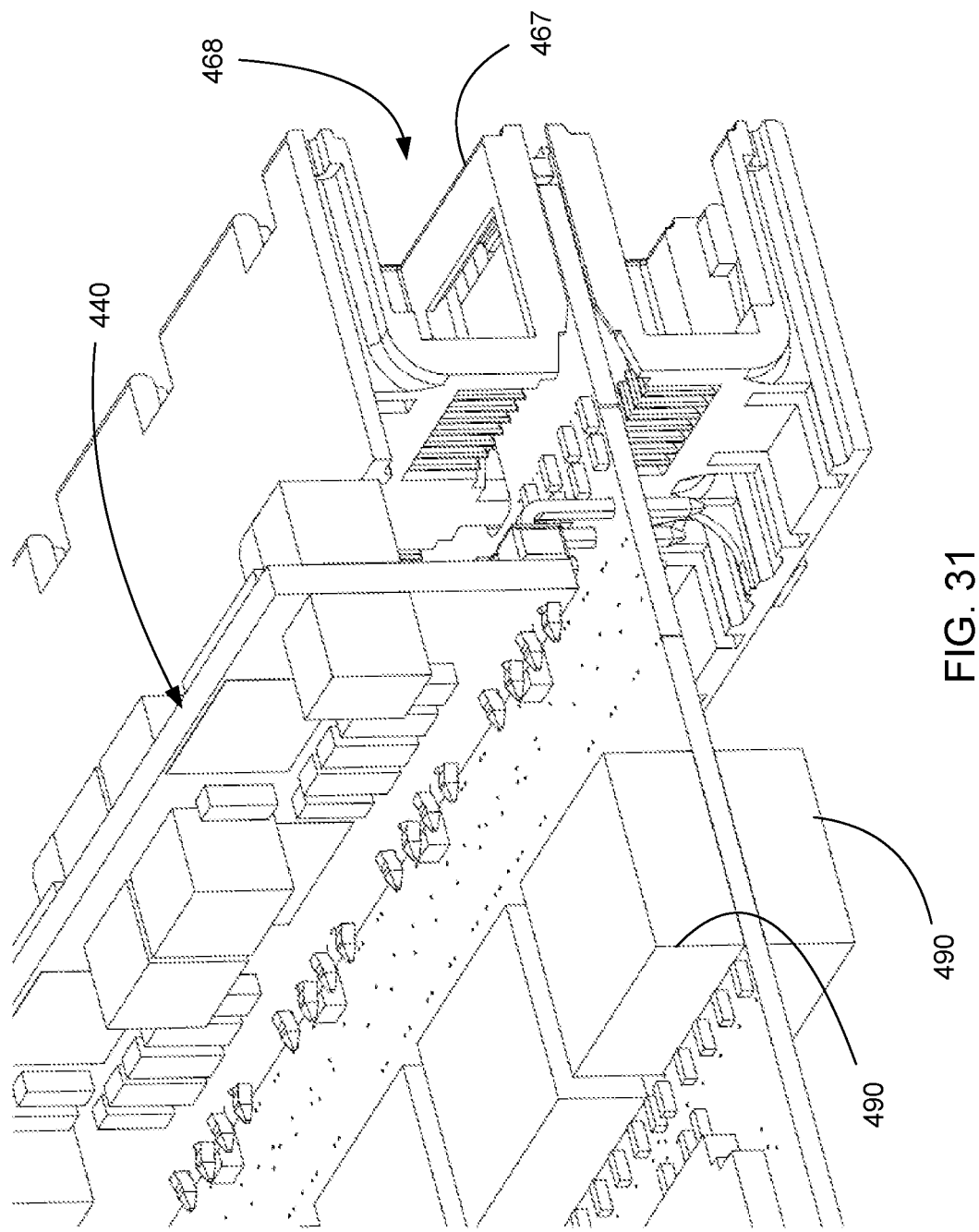
FIG. 31 illustrates another perspective view of the embodiment depicted in FIG. 28 with a chiclet removed.

FIGS. 23-35 illustrate features of another embodiment of a communication node 410 that includes a box 414 with a front face 415 that includes ports 418. A card module 420 with a circuit board 430 is positioned in the box 414 (which is shown in simplified fashion in FIG. 24 as it is expected normal components, not shown for purposes of brevity, will be included in the communication node 410). A port module 460 is mounted on the circuit board 430 and is positioned along the front face 415.

The depicted circuit board 430 has a front edge 432 with housing slots 434 provided therein and can be supported by legs 428 and fasteners 429 or via other mechanical structure in any desired manner. Connectors 435a and 435b are provided to provide signals and/or power to the circuit board 430 and one or more PHY chips 436 can be supported by the circuit board 430. Chiclets 450 are mounted on the circuit board 430 adjacent the front edge 432 between two housing slots 434.

As depicted, an optional Power over Ethernet (POE) card 440 is mounted on the circuit board and includes a POE board 442, POE circuitry 444 and a POE connector 446 to connect the POE board 442 to the circuit board 430. In the depicted embodiment the POE card is beneficially mounted in a vertical orientation to help conserve space.

As can be appreciated, the POE card 440 is positioned between transformer boxes 490 (that can include convention transformer magnetics such as described above) and the port module 460. This allows for ready insertion of power on the cable side of the transformer while providing isolation with the chip side and any PHY chips that may be included on the circuit board 430.

The port module 460 includes a shield 462 that mounts to a housing 466. The shield 462 can include EMI gaskets or other features to allow it to be electrically connected to the box 414 to provide acceptable electromagnetic interference (EMI) protection/shielding. The housing includes a front face 466a, sides 466b and a rear face 466c The shield 462 as depicted extends along the front face 466a and the sides 466b of the housing 466 but in an embodiment may extend along the front face 466a and only partially along the sides 466b to provide suitable EMI shielding while reducing cost. The housing 460 provides port recesses 468 that are configured to accept suitable plug connectors (such as RJ45 connectors). The housing 466 includes a front wall 467 that helps define a bottom surface of the port recess 468 and protects the terminals 456. The housing also includes a terminal wall 470 that is angled and a terminal comb 471, more of which will be discussed below.

As can be appreciated, the chiclet 450 with a frame 451 and terminals 456 can be attached to the circuit board 430 via a solder attach method and can be processed along with other components that are attached to the circuit board 430. The chiclet can include a contact beam portion 459 that is configured to engage contacts of a mating connector and ends 458 that engage the terminal wall 470. Once the chiclet 450 is attached, the housing 460 is mounted to front edge 432 over the chiclets 450. Specifically, the housing 460 includes a slot wall 479a that has an attachment channel 472 (as depicted there are two opposing attachment channels 472 on both sides of each chiclet 450). The attachment channel 472 includes walls 472a, 472b and 472c that are configured to extend be positioned in the housing slot 434 and are configured to extend on edges 434a that define the slot 434. In an embodiment the walls 472a-472c can be designed to have a slight clearance with edges 434a. The attachment channel 472 also includes shoulders 477a, 477b that are configured to be positioned on or adjacent a surface of the chiclet frame 451.

During mounting of the housing 460 onto the circuit board 430, the terminal comb 471 slips past the terminals 456 and once installed provides physical separation of the terminals 456 and also helps protect the terminals 456 from being damaged during insertion of a mating plug connector. The terminal wall 470 can be configured to slightly press down on the ends 458 to provide additional location precision of the beam portion 459 and such a configuration can also help provide suitable contact force with mating contacts of a plug connector.

Figure 32:
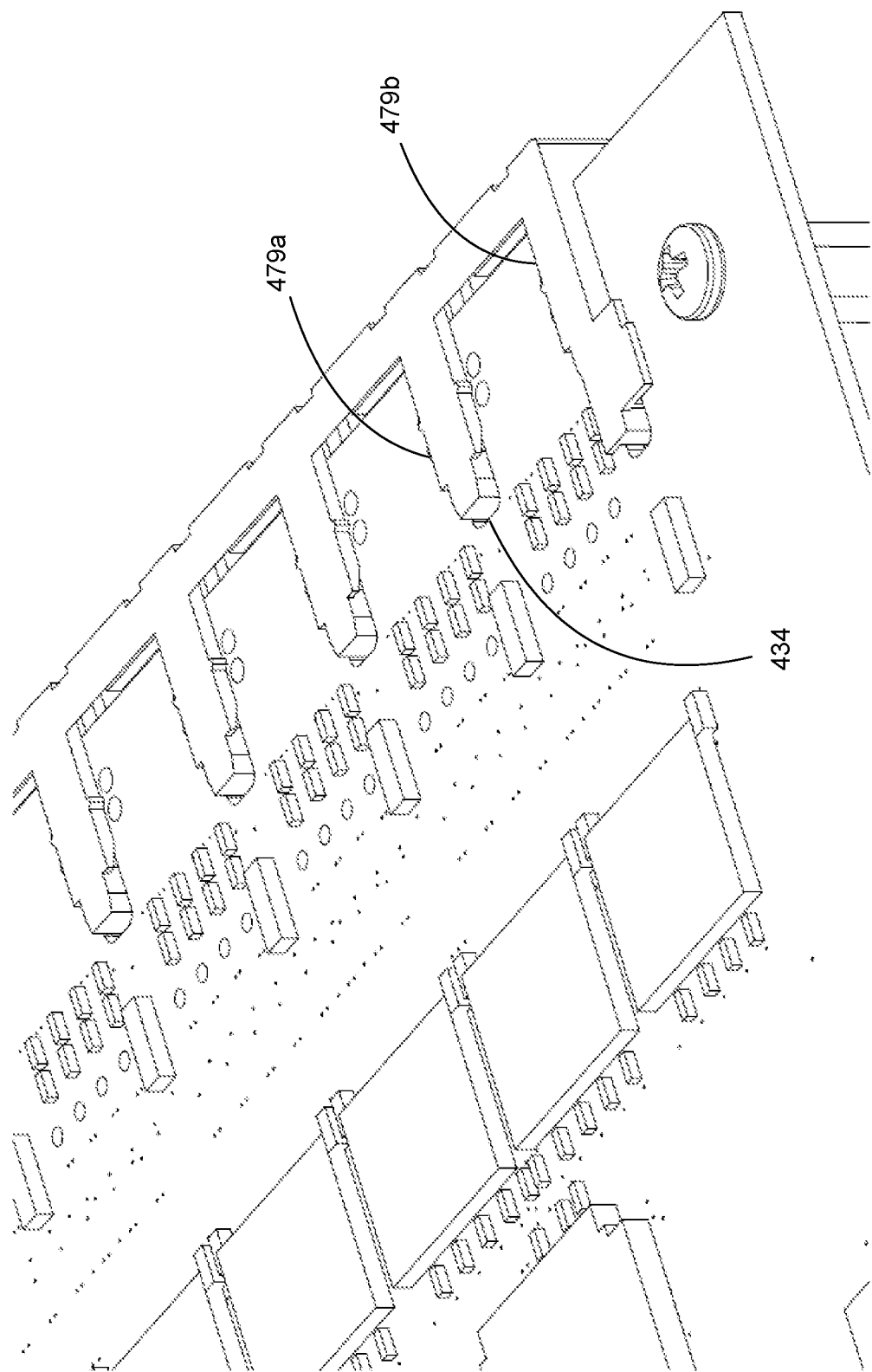
FIG. 32 illustrates a perspective cross-sectional view of the embodiment depicted in FIG. 27, taken along line 32-32, with the chiclet removed.
Figure 33:
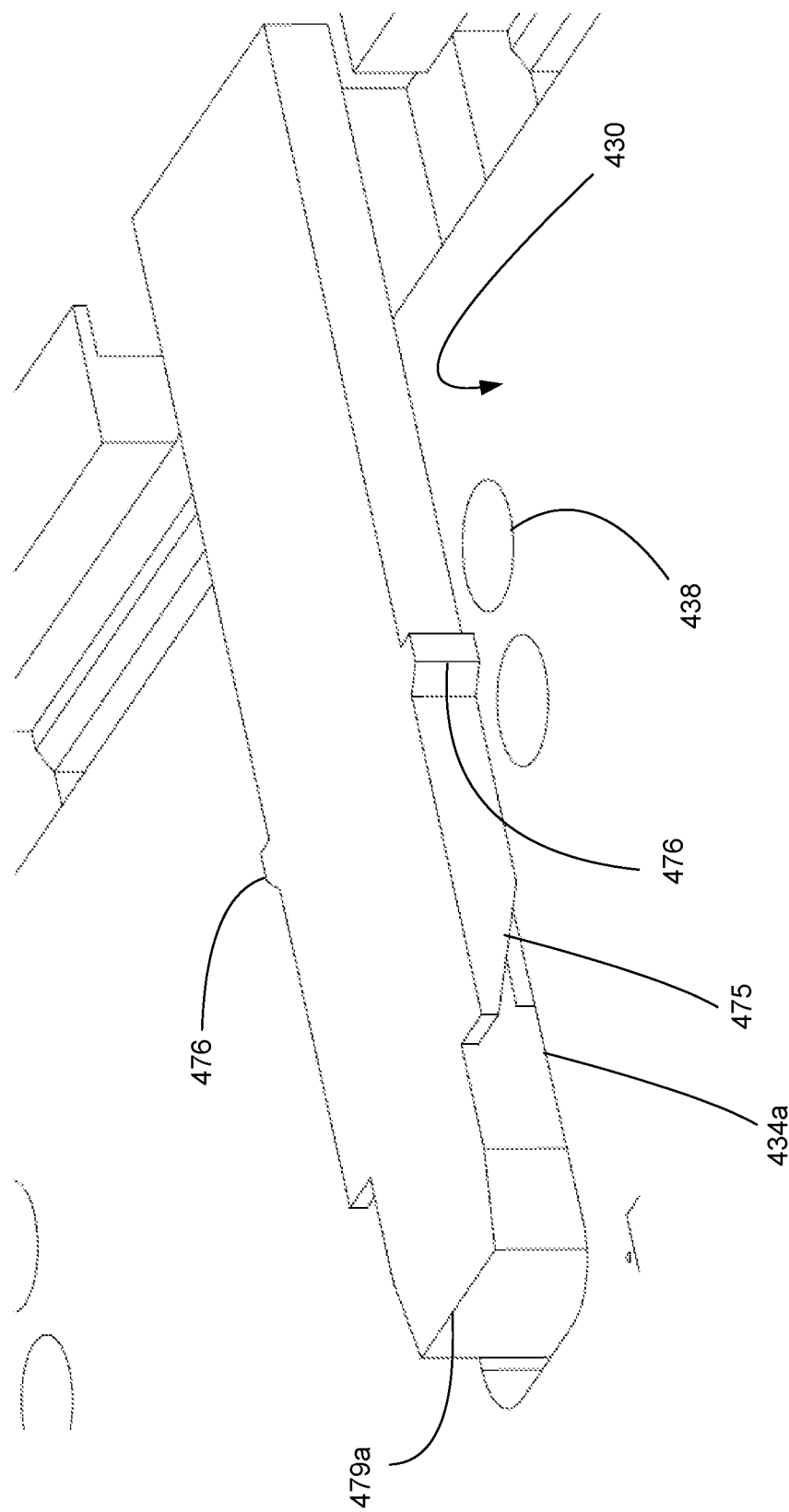
FIG. 33 illustrates an enlarged perspective view of the embodiment depicted in FIG. 32.
Figure 34:
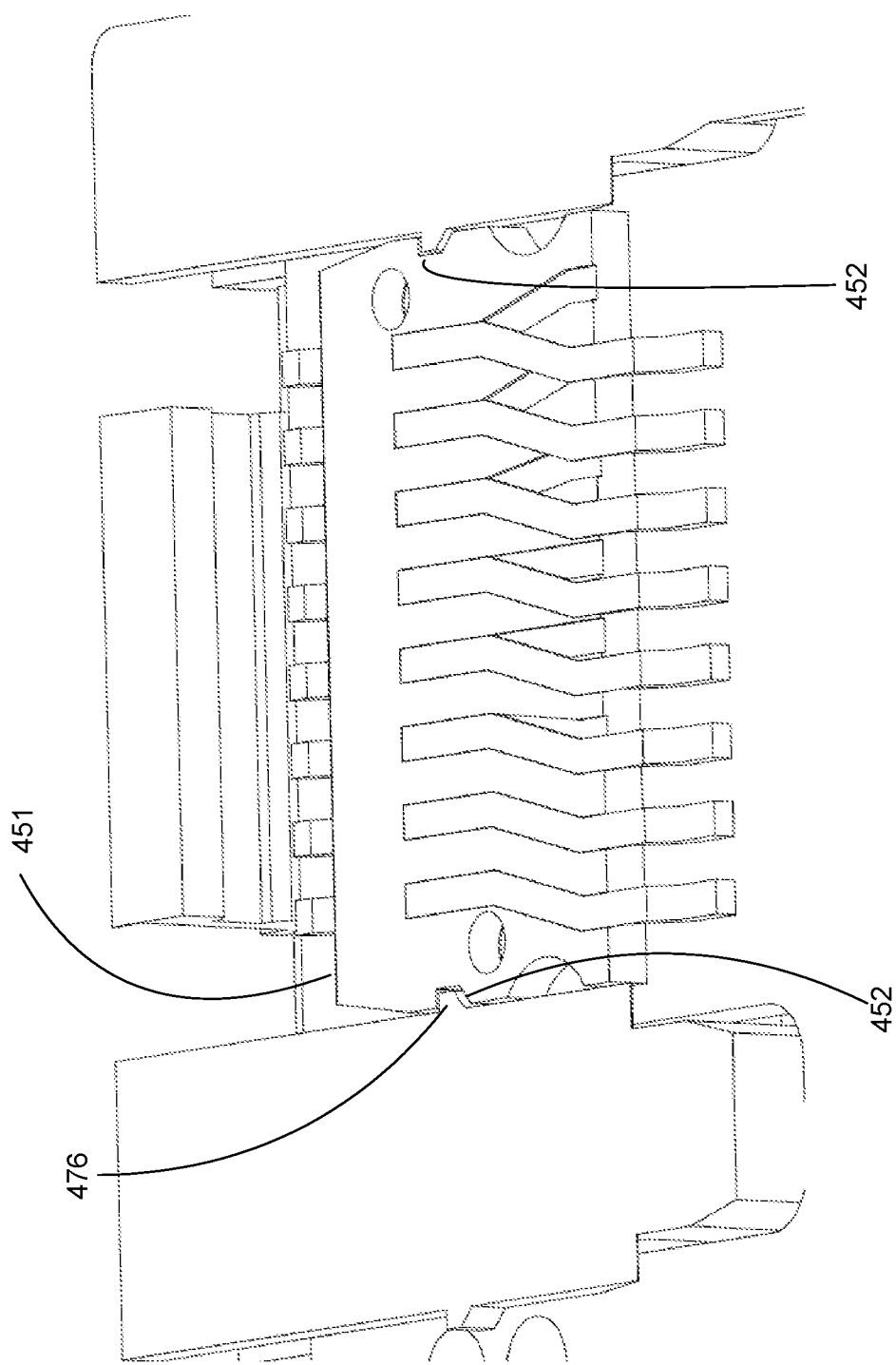
FIG. 34 illustrates an enlarged perspective view of the embodiment depicted in FIG. 32 but with the chiclet included.
Figure 35:
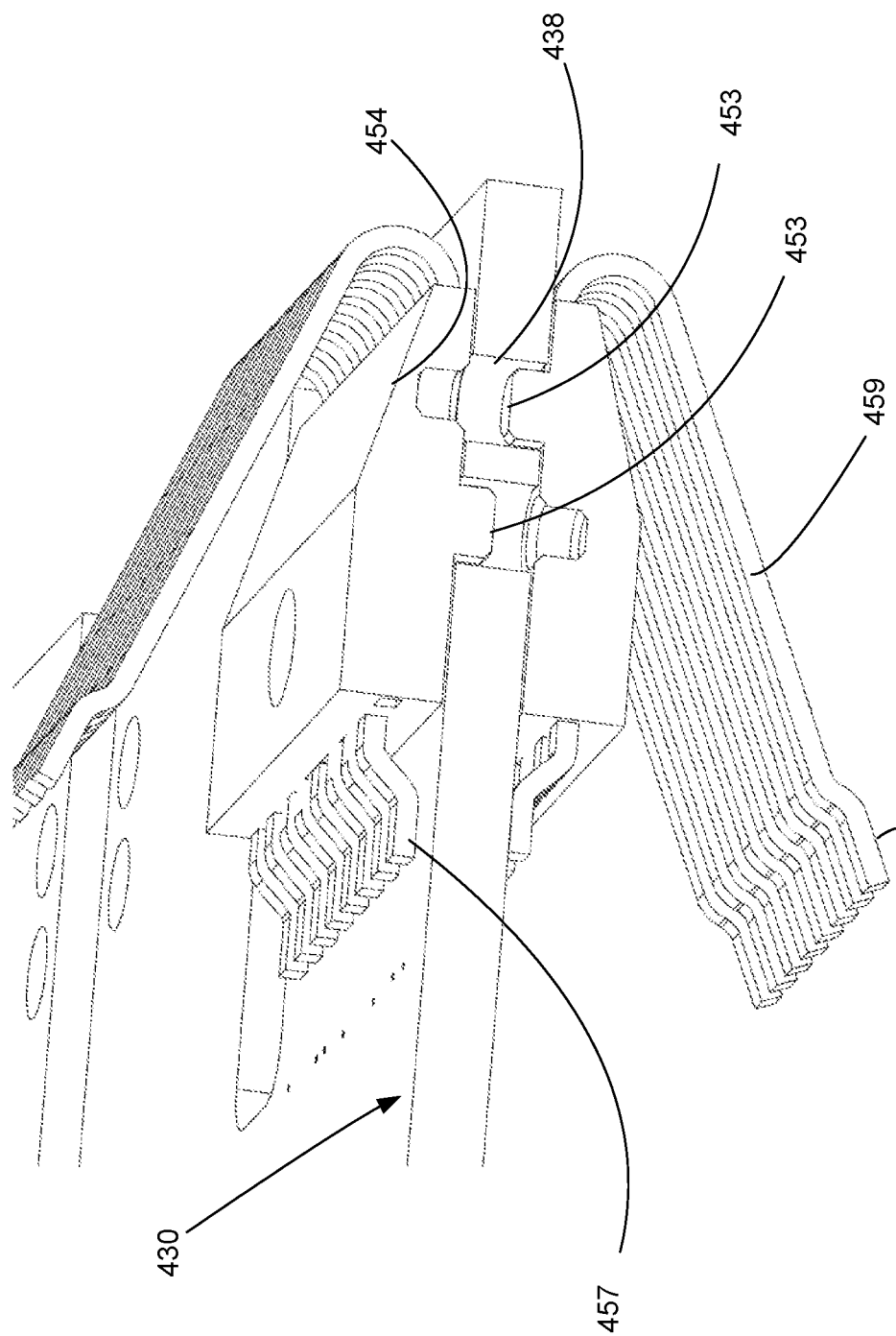
FIG. 35 illustrates a perspective cross-sectional view of an embodiment of a chiclet mounted to a circuit board.

As can be appreciated from FIG. 32, the housing 466 includes a plurality of slot walls 479a and also includes end slot walls 479b. The end slot walls 479b can be configured differently than the slot walls 479a to ensure the housing 466 is mounted in the correct location. For example, the end slot walls 479b can be longer than the slot walls 479a so that the end slot walls can only be inserted into slots appropriately sized.

To ease installation of the housing 466, angled surfaces, such as angled surface 475 and angled surface 454 can be provided. The housing 466 is pressed onto the front edge 432 and over the chiclets 450. During the process, a rib 476 in the attachment channel 472 engages a notch 452 in the frame 451 in a press fit manner (e.g., snaps into place). The engagement of the ribs 476 with the notches 452 helps ensure there is minimal relative movement between the housing 466 and the chiclet 450. Because the frame 451 can be securely mounted to the circuit board 430 via solder attach from tails 457 of the terminals 456, the chiclet 450 becomes securely mounted to the circuit board 430. To provide further structural support, pegs 453 are positioned in the chiclet apertures 438 and the pegs 453 are configured to substantially limit movement of the chiclet 450 (and the housing 466) along the surface of the circuit board 430 (e.g., if the surface of the circuit board surface defines an X and Y axis than movement in the X and Y direction is substantially constrained). The thickness of the frame 451 can help prevent movement of the housing 466 in a Z direction by engaging the attachment channel 472. As a result, once installed, movement of the housing 466 is substantially constrained due to the fit between the attachment channel 472 and the frame 451.

As can be appreciated from the above disclosure, the depicted design allows for a cost effective and efficient package that provides suitable performance while offering a number of possible design iterations. For example, while a single card module is depicted that supports multiple housing, a card module can be configured to provide a single housing and multiple card modules could be positioned in a single box.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A communication node, comprising:
   a case having a first face with plurality of ports;
   a card module mounted near the front face, the card module including:
   a circuit board, the circuit board including a front edge and a rear edge and a plurality of housing slots positioned at the front edge;
   a chiclet mounted on the circuit board between two housing slots, the chiclet having a plurality of terminals, each terminal of the plurality of terminals including a tail electrically connected to the circuit board;
   a port module that includes a housing with a plurality of slot walls, the slot walls positioned in the housing slots, the housing including a port recess aligned with the plurality of terminals; and
   a transformer box mounted on the circuit board, the transformer box associated with the port recesses and configured to provide magnetic coupling between a cable side and a chip side of the transformer box, the transformer box positioned between the rear edge and the housing.

2. The communication node of claim 1, further comprising a Power over Ethernet (POE) card mounted on the circuit board, the POE card configured to inject power into center-taps provided on the cable side to provide POE power.

3. The communication node of claim 2, wherein the POE card is positioned between the transformer box and the housing.

4. The communication node of claim 3, wherein the POE card is positioned vertically.

5. The communication node of claim 1, wherein the slot wall includes an attachment channel that engages the chiclet, the engagement helping to secure the housing to the chiclet.

6. The communication node of claim 4, wherein the chiclet includes a notch and the attachment channel includes a rib that engages the notch in a press fit manner.

7. The communication node of claim 1, wherein the housing includes a comb and terminal wall that combine to position the terminals in the port recess.

8. The communication node of claim 1, wherein the port module includes a shield mounted on the housing.

9. The communication node of claim 1, wherein the tails are soldered to the circuit board.

* * * * *